United States Patent [19]

Gormish et al.

[11] Patent Number: 5,475,388
[45] Date of Patent: Dec. 12, 1995

[54] METHOD AND APPARATUS FOR USING FINITE STATE MACHINES TO PERFORM CHANNEL MODULATION AND ERROR CORRECTION AND ENTROPY CODING

[75] Inventors: Michael J. Gormish, Stanford; James D. Allen, Castro Valley, both of Calif.

[73] Assignees: Ricoh Corporation, Menlo Park, Calif.; Ricoh Company Ltd., Tokyo, Japan

[21] Appl. No.: 142,504

[22] Filed: Oct. 22, 1993

Related U.S. Application Data

[63] Continuation-in-part of Ser. No. 931,156, Aug. 17, 1992, Pat. No. 5,273,478.
[51] Int. Cl.⁶ ............................ H03M 7/40; H03M 13/00
[52] U.S. Cl. .............................. 341/107; 341/67; 341/58; 341/94; 341/106
[58] Field of Search .................................. 341/58, 59, 65, 341/67, 72, 107, 106, 51, 94

[56] References Cited

U.S. PATENT DOCUMENTS

| | | | |
|---|---|---|---|
| 4,413,251 | 11/1983 | Adler et al. ................................ | 341/59 |
| 4,488,143 | 12/1984 | Martin ........................................ | 341/59 |
| 5,265,127 | 11/1993 | Betts et al. ................................ | 371/43 |

OTHER PUBLICATIONS

Guazzo, A General Minimum Redundancy Source–Coding Algorithm, IEEE Transactions on Information Theory, vol. IT–26, No. 1 Jan. 1980, pp. 15–25.

*Primary Examiner*—Howard L. Williams
*Attorney, Agent, or Firm*—Blakely, Sokoloff, Taylor & Zafman

[57] ABSTRACT

The present invention provides an encoding and decoding apparatus used for the compression and expansion of data. A state machine is provided having a plurality of states. Each state has at least one transition pair. Each element of the transition pair comprises zero or more bits representative of the compact code to be output and the identification of the next state to proceed to. The transition pair reflects an output for a yes and no response associated with the probability of the data to be compacted and whether the data falls within that probability.

57 Claims, 16 Drawing Sheets

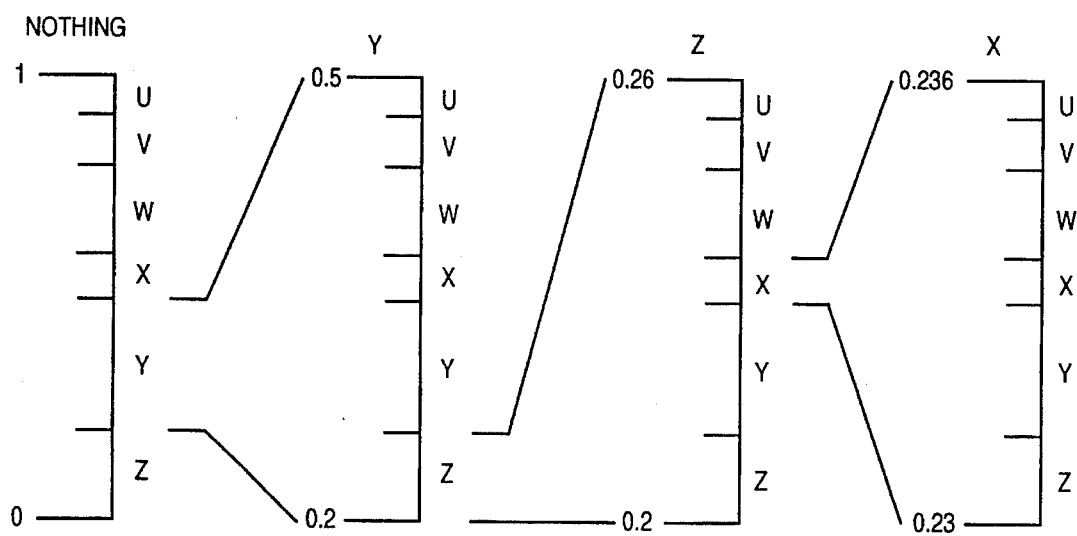
FIG_1A
FIG_1B

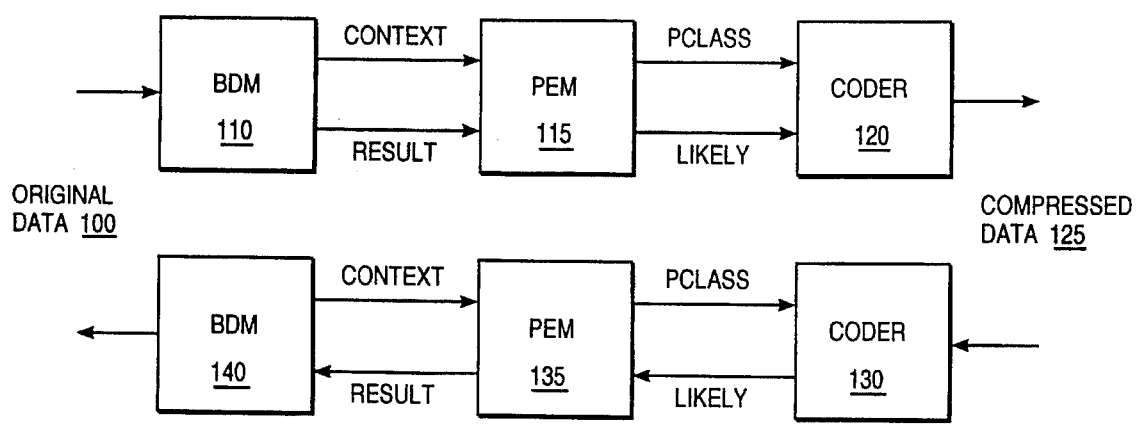
FIG_2
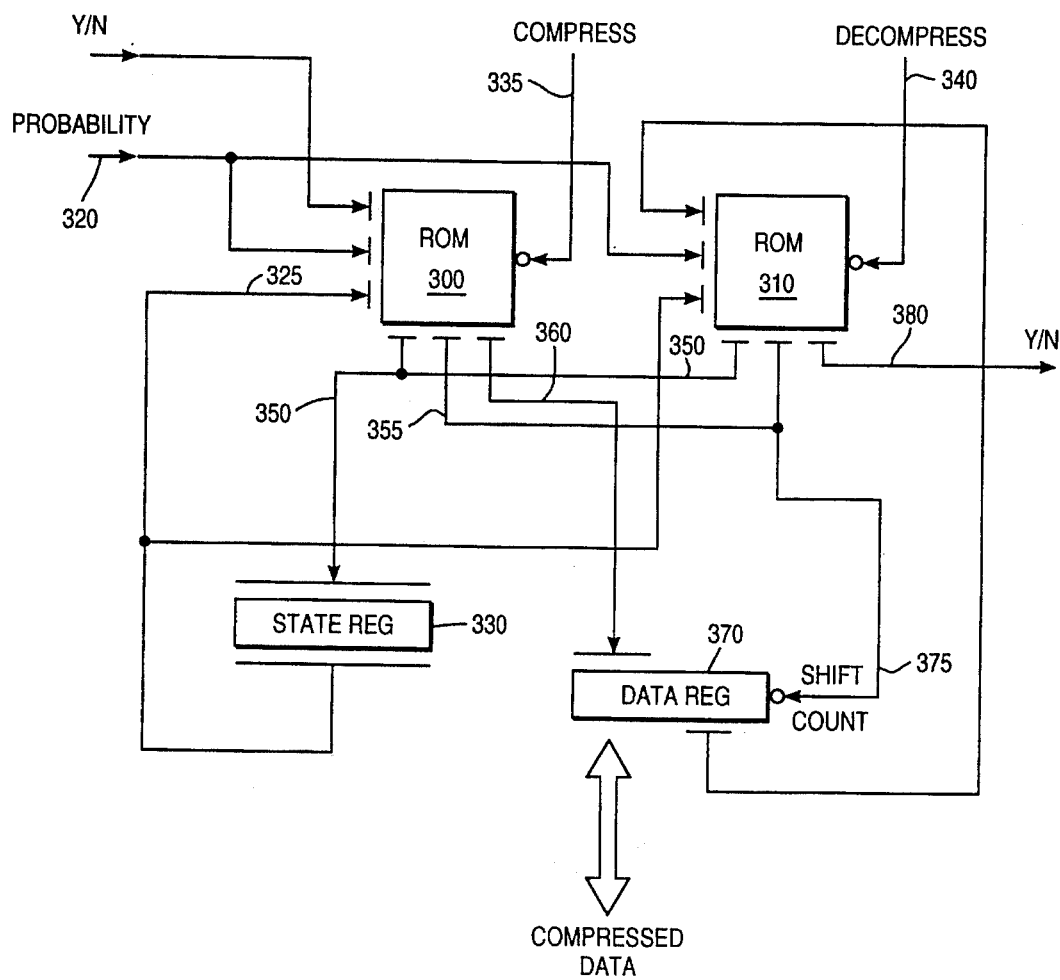
FIG_3

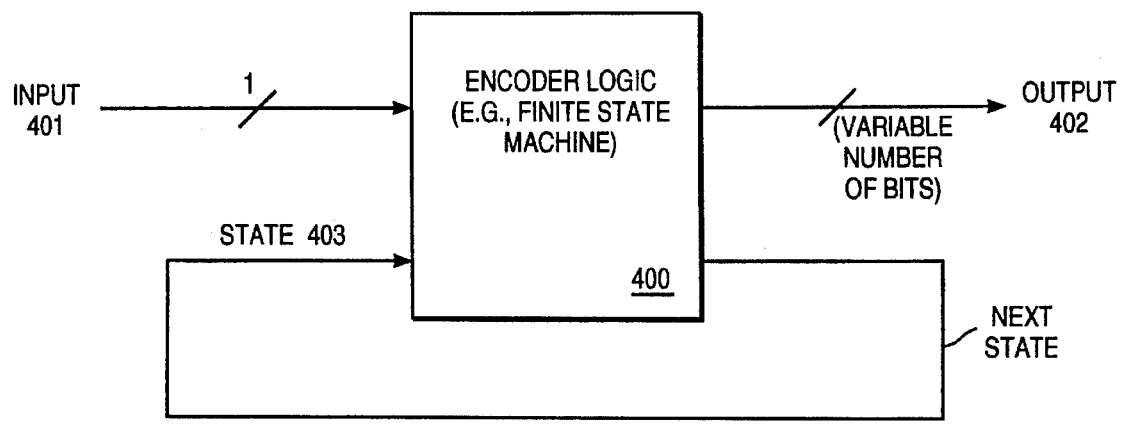
FIG_4
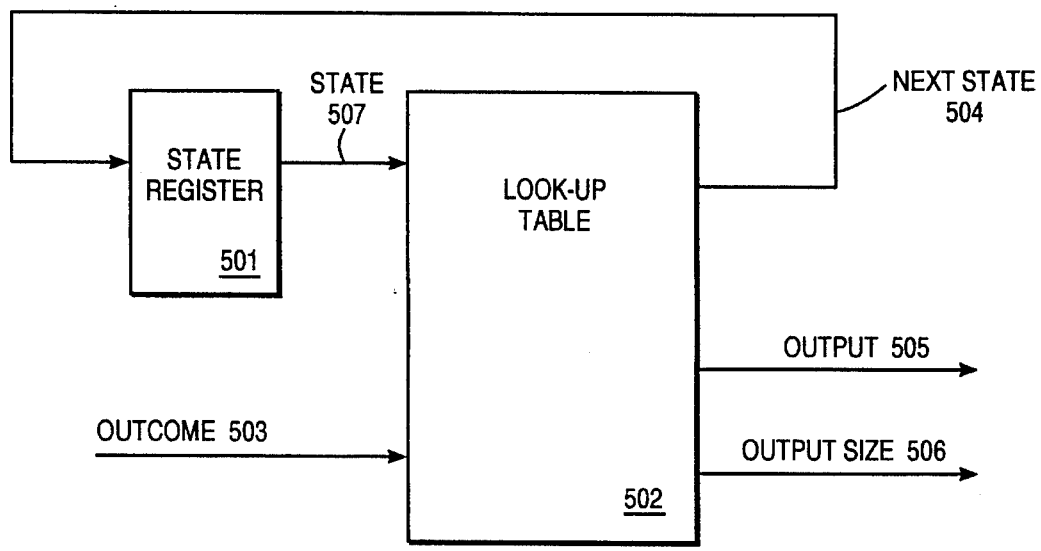
FIG_5

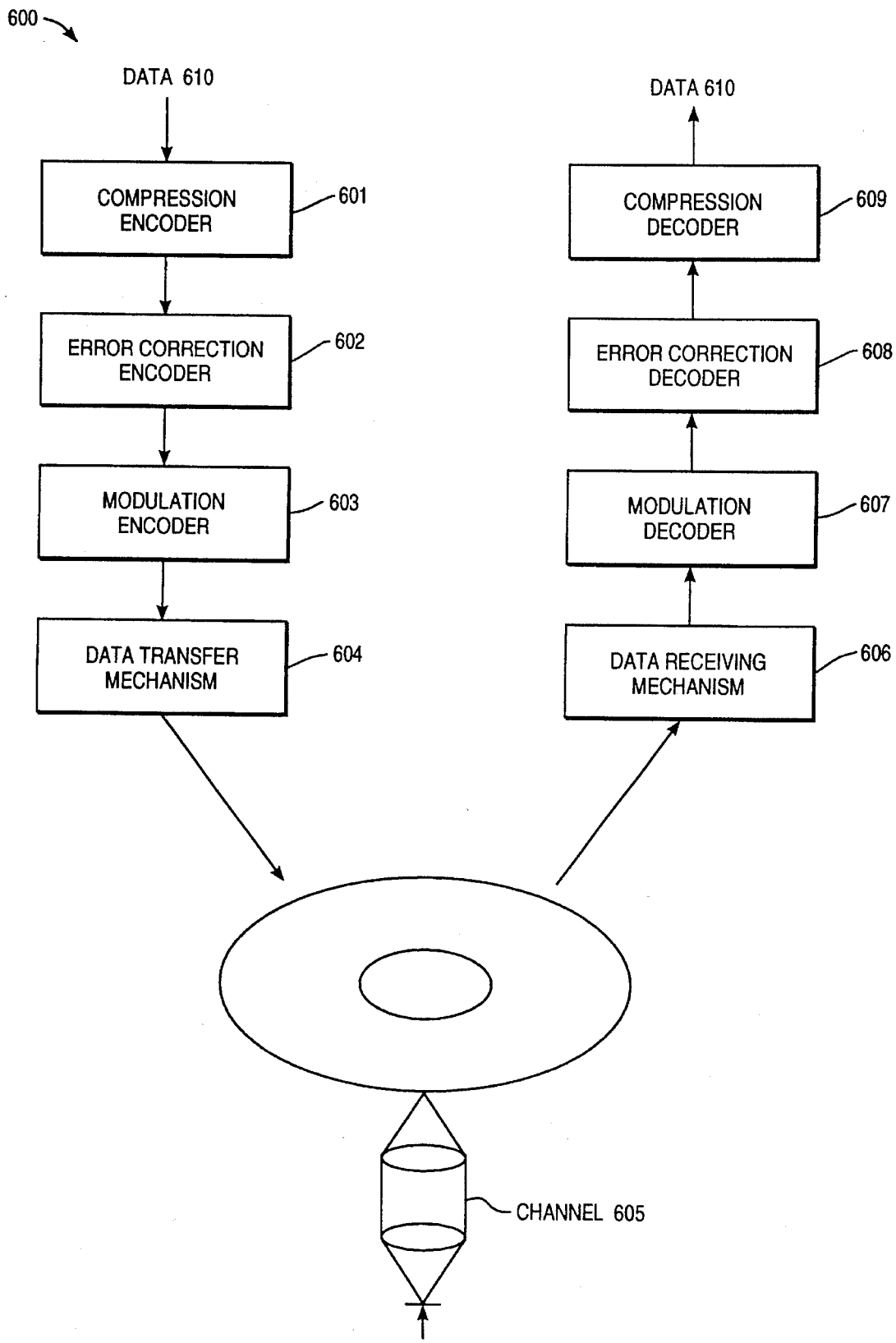
FIG_6

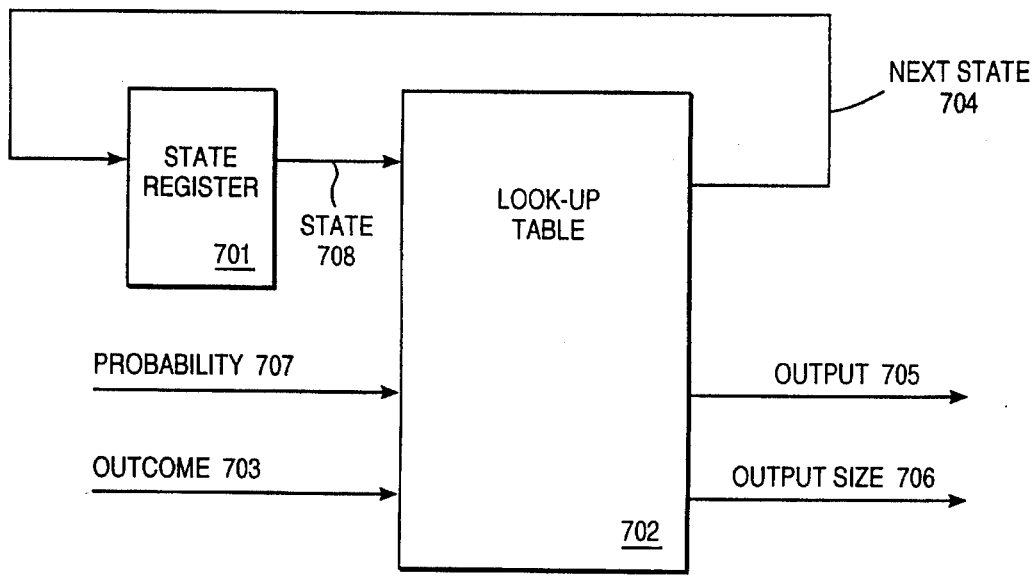
FIG_7
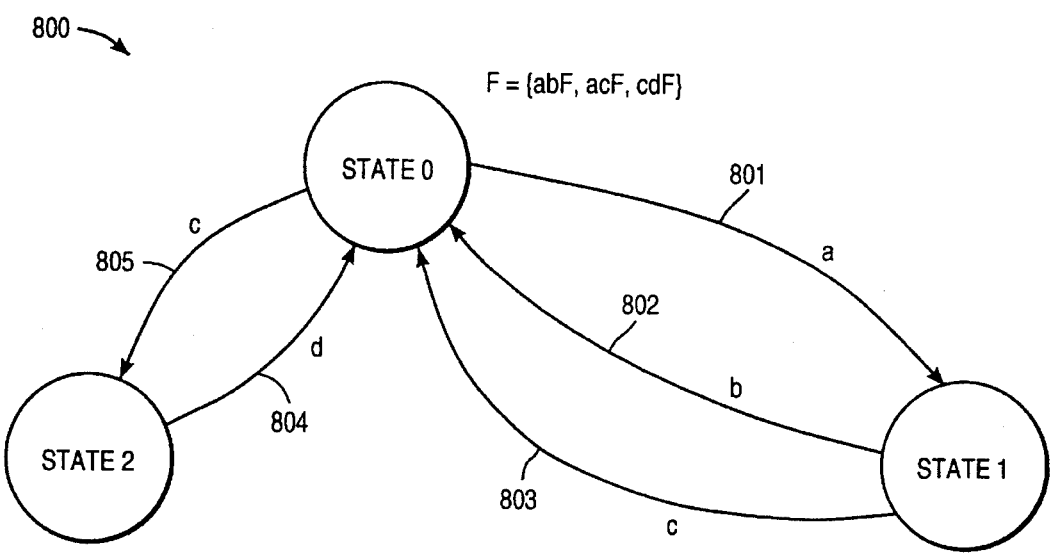
FIG_8

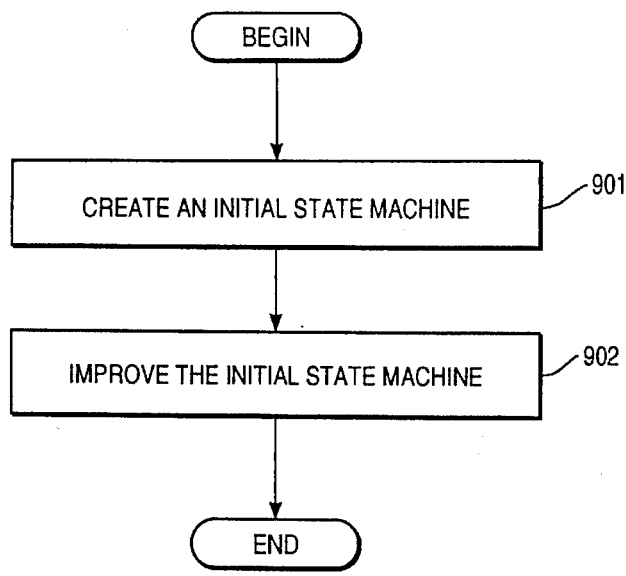
FIG_9
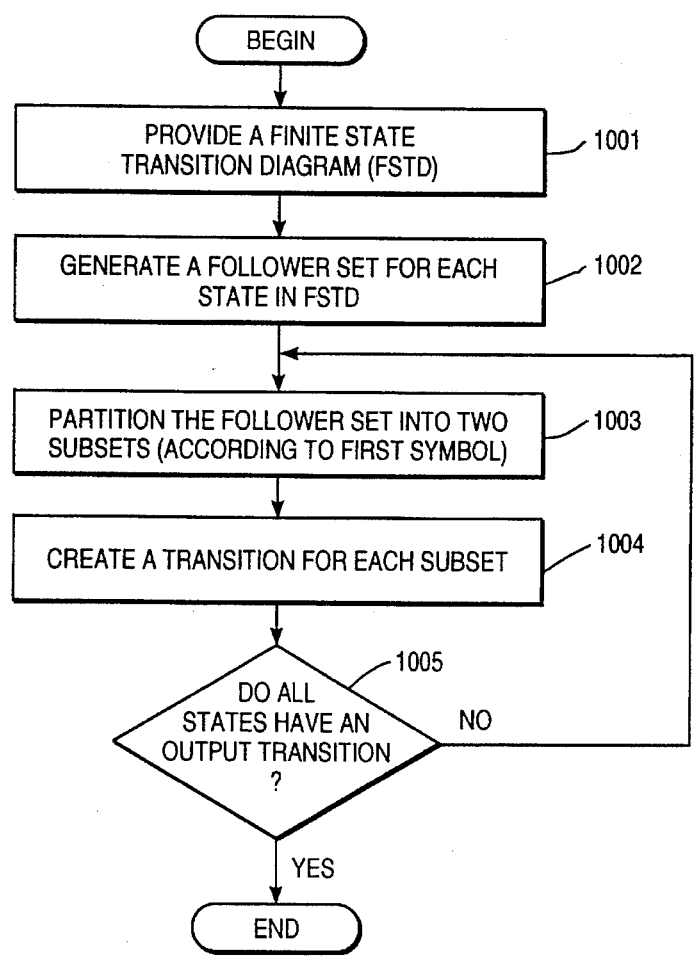
FIG_10

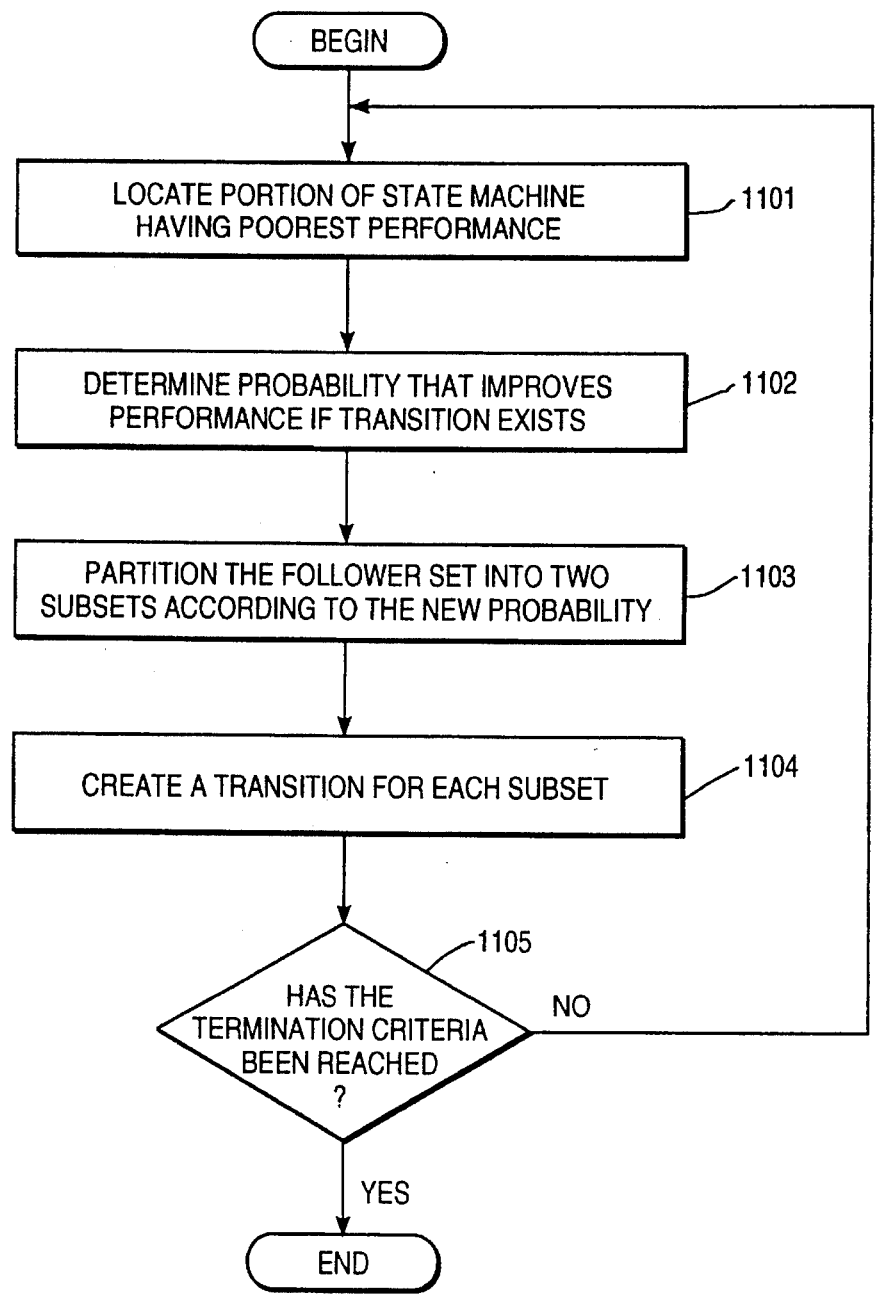
FIG_11

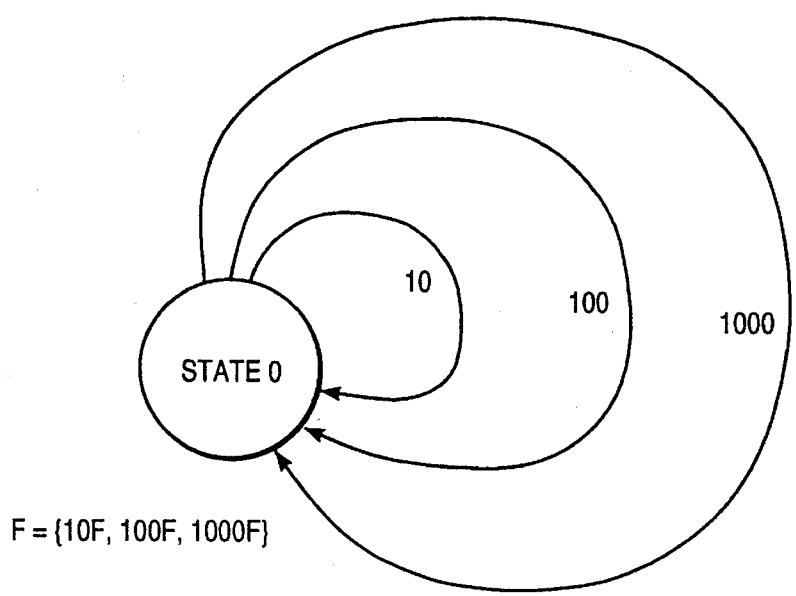
FIG_12
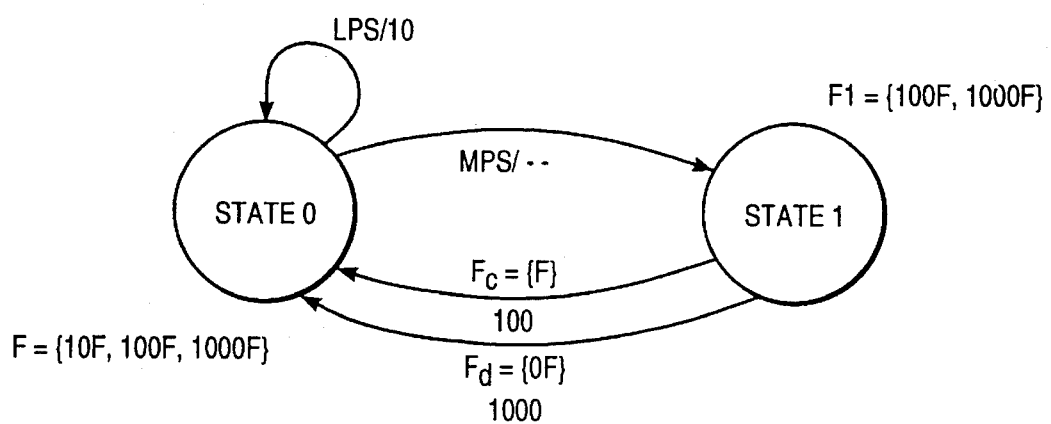
FIG_13A

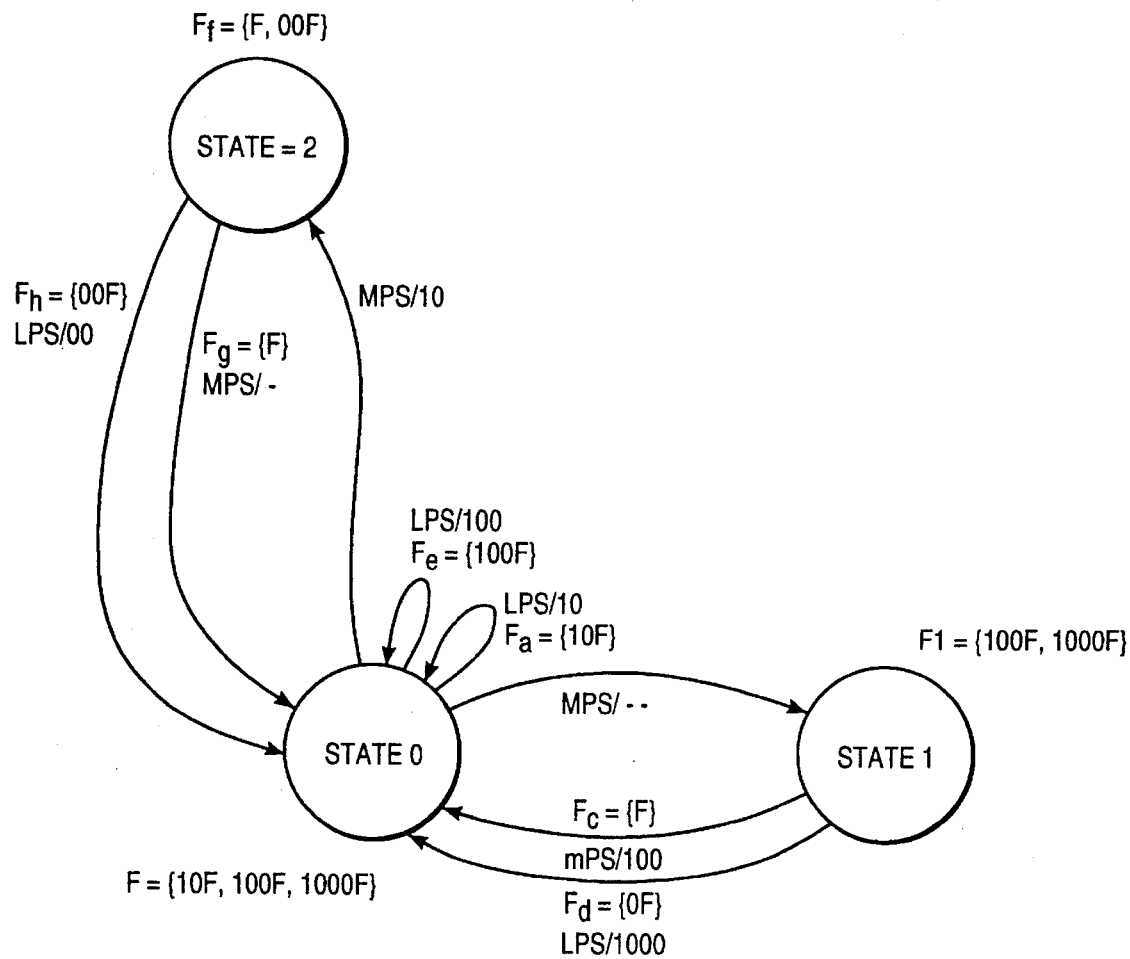
FIG_13B

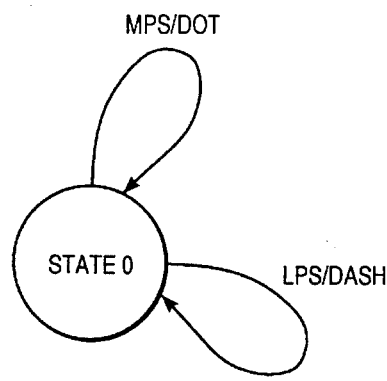
FIG_14
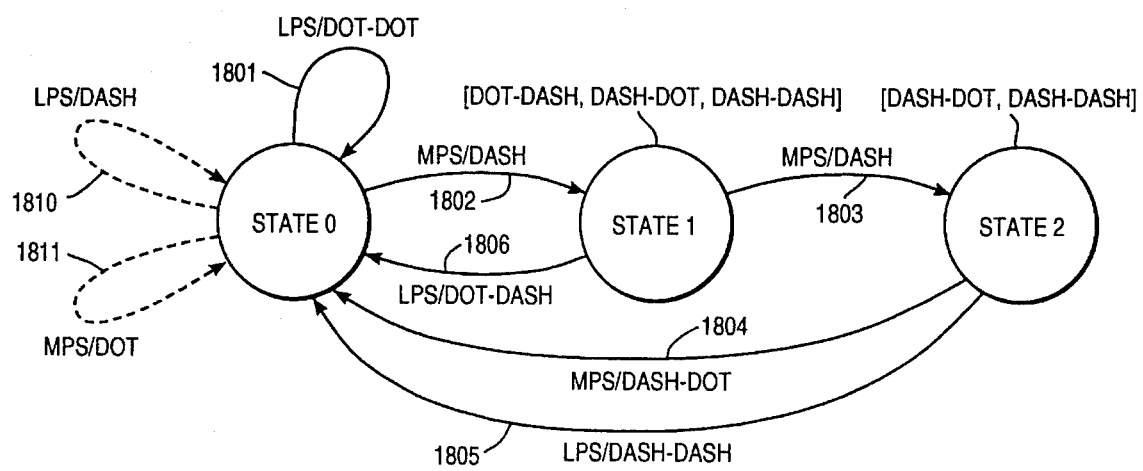
FIG_15

2 STATE MACHINE

| NXT STATE | MPS SIZ | OUTPUT | NXT | LPS SIZ | OUTPUT | THRESHOLD |
|---|---|---|---|---|---|---|
| STATE 0 : | | | | | | |
| 0 | 1 | 1 | 0 | 1 | 0 | 0.6439 |
| 1 | 0 | - | 0 | 2 | 11 | 1.0000 |
| STATE 1 : | | | | | | |
| 0 | 1 | 0 | 0 | 2 | 10 | 1.0000 |

FIG_16A

4 STATE MACHINE

| NXT STATE | MPS SIZ | OUTPUT | NXT | LPS SIZ | OUTPUT | THRESHOLD |
|---|---|---|---|---|---|---|
| STATE 0 : | | | | | | |
| 0 | 1 | 1 | 0 | 1 | 0 | 0.6419 |
| 1 | 0 | - | 0 | 2 | 11 | 0.8101 |
| 2 | 0 | - | 0 | 3 | 111 | 1.0000 |
| STATE 1 : | | | | | | |
| 0 | 1 | 0 | 0 | 2 | 10 | 0.7963 |
| 3 | 0 | - | 0 | 3 | 101 | 1.0000 |
| STATE 2 : | | | | | | |
| 0 | 1 | 0 | 1 | 1 | 1 | 0.7363 |
| 1 | 0 | - | 0 | 3 | 110 | 1.0000 |
| STATE 3 : | | | | | | |
| 0 | 1 | 0 | 0 | 3 | 100 | 1.0000 |

FIG_16B

6 STATE MACHINE

| NXT STATE | MPS SIZ | OUTPUT | NXT | LPS SIZ | OUTPUT | THRESHOLD |
|---|---|---|---|---|---|---|
| STATE 0 : | | | | | | |
| 0 | 1 | 1 | 0 | 1 | 0 | 0.6379 |
| 1 | 0 | - | 0 | 2 | 11 | 1.8203 |
| 2 | 0 | - | 0 | 3 | 111 | 0.9000 |
| 4 | 0 | - | 0 | 4 | | 1.0000 |
| STATE 1 : | | | | | | |
| 0 | 1 | 0 | 0 | 2 | 10 | 0.8039 |
| 3 | 0 | - | 0 | 3 | 101 | 0.8512 |
| 5 | 0 | - | 0 | 4 | | 1.0000 |
| STATE 2 : | | | | | | |
| 0 | 1 | 0 | 1 | 1 | 1 | 0.7341 |
| 1 | 0 | - | 0 | 3 | 110 | 1.0000 |
| STATE 3 : | | | | | | |
| 0 | 1 | 0 | 0 | 3 | 100 | 1.0000 |
| STATE 4 : | | | | | | |
| 0 | 1 | 0 | 2 | 1 | 1 | 0.6823 |
| 1 | 0 | - | 1 | 2 | 11 | 0.8774 |
| 2 | 0 | - | 0 | 4 | 1110 | 1.0000 |
| STATE 5 : | | | | | | |
| 0 | 1 | 0 | 1 | 2 | 10 | 0.8654 |
| 3 | 0 | - | 0 | 4 | 1010 | 1.0000 |

FIG_16C

|  | MPS |  |  | LPS |  |  |
|---|---|---|---|---|---|---|
| NXT STATE | NUM | OUTPUT |  | NXT | NUM | OUTPUT | THRESHOLD |

| NXT STATE | NUM | OUTPUT |  | NXT | NUM | OUTPUT | THRESHOLD |
|---|---|---|---|---|---|---|---|
| STATE | | 0: | | | | | |
| 11 | 0 | - | | 50 | 1 | 1 | 0.5764 |
| 3 | 0 | - | | 9 | 1 | 1 | 0.6585 |
| 5 | 0 | - | | 41 | 1 | 1 | 0.6982 |
| 1 | 0 | - | | 0 | 2 | 11 | 0.7947 |
| 8 | 0 | - | | 9 | 2 | 11 | 0.8348 |
| 2 | 0 | - | | 0 | 3 | 111 | 0.9004 |
| 55 | 0 | - | | 9 | 3 | 111 | 0.9341 |
| 4 | 0 | - | | 0 | 4 | 1111 | 0.9557 |
| 6 | 0 | - | | 0 | 5 | 11111 | 0.9756 |
| 16 | 0 | - | | 0 | 6 | 111111 | 0.9891 |
| 27 | 0 | - | | 0 | 7 | 1111111 | 1.0000 |
| STATE | | 1: | | | | | |
| 8 | 1 | 0 | | 58 | 0 | - | 0.5000 |
| 2 | 1 | 0 | | 17 | 0 | - | 0.6080 |
| 0 | 1 | 0 | | 0 | 2 | 10 | 0.7255 |
| 11 | 0 | - | | 9 | 2 | 10 | 0.7947 |
| 3 | 0 | - | | 0 | 3 | 101 | 0.8742 |
| 5 | 0 | - | | 0 | 4 | 1011 | 0.9341 |
| 19 | 0 | - | | 0 | 6 | 101111 | 1.0000 |
| STATE | | 2: | | | | | |
| 0 | 1 | 0 | | 1 | 1 | 1 | 0.6585 |
| 12 | 0 | - | | 0 | 2 | 00 | 0.7675 |
| 7 | 0 | - | | 17 | 1 | 1 | 0.7947 |
| 1 | 0 | - | | 0 | 3 | 110 | 0.9004 |
| 8 | 0 | - | | 0 | 4 | 1101 | 0.9557 |
| 18 | 0 | - | | 0 | 5 | 11011 | 1.0000 |
| STATE | | 3: | | | | | |
| 1 | 1 | 0 | | 10 | 0 | - | 0.6982 |
| 0 | 1 | 0 | | 0 | 3 | 100 | 0.8742 |
| 11 | 0 | - | | 0 | 4 | 1001 | 0.9341 |
| 15 | 0 | - | | 0 | 5 | 10011 | 1.0000 |
| STATE | | 4: | | | | | |
| 0 | 1 | 0 | | 2 | 1 | 1 | 0.6585 |
| 1 | 0 | - | | 1 | 2 | 11 | 0.8742 |
| 2 | 0 | - | | 0 | 4 | 1110 | 1.0000 |
| STATE | | 5: | | | | | |
| 31 | 1 | 0 | | 57 | 0 | - | 0.5764 |
| 2 | 1 | 0 | | 36 | 0 | - | 0.6585 |
| 0 | 1 | 0 | | 1 | 2 | 10 | 0.7947 |
| 25 | 0 | - | | 17 | 2 | 10 | 0.8742 |
| 3 | 0 | - | | 0 | 4 | 1010 | 0.9341 |
| 40 | 0 | - | | 0 | 5 | 10101 | 1.0000 |
| STATE | | 6: | | | | | |
| 0 | 1 | 0 | | 4 | 1 | 1 | 0.6585 |
| 1 | 0 | - | | 2 | 2 | 11 | 0.8348 |
| 2 | 0 | - | | 1 | 3 | 111 | 1.0000 |
| STATE | | 7: | | | | | |
| 2 | 1 | 0 | | 26 | 0 | - | 0.5764 |
| 48 | 0 | - | | 0 | 2 | 00 | 0.6585 |
| 0 | 1 | 0 | | 2 | 2 | 10 | 0.7947 |
| 3 | 0 | - | | 1 | 3 | 101 | 1.0000 |
| STATE | | 8: | | | | | |
| 0 | 1 | 0 | | 3 | 1 | 1 | 0.6982 |
| 24 | 0 | - | | 0 | 2 | 00 | 0.7675 |
| 5 | 0 | - | | 10 | 1 | 1 | 0.8742 |
| 1 | 0 | - | | 0 | 4 | 1100 | 0.9557 |
| 31 | 0 | - | | 0 | 5 | 11001 | 1.0000 |

FIG_16D1

|  | MPS | | | LPS | | | |
|---|---|---|---|---|---|---|---|
| NXT STATE | NUM | OUTPUT | | NXT | NUM | OUTPUT | THRESHOLD |

STATE 9:
| NXT STATE | NUM | OUTPUT | NXT | NUM | OUTPUT | THRESHOLD |
|---|---|---|---|---|---|---|
| 37 | 0 | - | 41 | 1 | 1 | 0.5764 |
| 0 | 1 | 1 | 0 | 2 | 01 | 0.7675 |
| 12 | 0 | - | 0 | 3 | 111 | 0.8742 |
| 22 | 0 | - | 0 | 4 | 1111 | 0.9341 |
| 29 | 0 | - | 0 | 5 | 11111 | 1.0000 |

STATE 10:
| NXT STATE | NUM | OUTPUT | NXT | NUM | OUTPUT | THRESHOLD |
|---|---|---|---|---|---|---|
| 0 | 3 | 011 | 0 | 3 | 100 | 0.6585 |
| 14 | 0 | - | 0 | 4 | 1001 | 0.8348 |
| 28 | 0 | - | 0 | 5 | 10011 | 1.0000 |

STATE 11:
| NXT STATE | NUM | OUTPUT | NXT | NUM | OUTPUT | THRESHOLD |
|---|---|---|---|---|---|---|
| 32 | 0 | - | 0 | 2 | 00 | 0.6080 |
| 1 | 1 | 0 | 14 | 0 | - | 0.7255 |
| 2 | 1 | 0 | 13 | 0 | - | 0.8348 |
| 0 | 1 | 0 | 0 | 4 | 1000 | 1.0000 |

STATE 12:
| NXT STATE | NUM | OUTPUT | NXT | NUM | OUTPUT | THRESHOLD |
|---|---|---|---|---|---|---|
| 1 | 1 | 1 | 0 | 2 | 01 | 0.7255 |
| 21 | 0 | - | 0 | 3 | 110 | 0.8742 |
| 24 | 0 | - | 0 | 4 | 1101 | 1.0000 |

STATE 13:
| NXT STATE | NUM | OUTPUT | NXT | NUM | OUTPUT | THRESHOLD |
|---|---|---|---|---|---|---|
| 0 | 4 | 0111 | 0 | 4 | 1000 | 0.6585 |
| 20 | 0 | - | 0 | 5 | 10001 | 1.0000 |

STATE 14:
| NXT STATE | NUM | OUTPUT | NXT | NUM | OUTPUT | THRESHOLD |
|---|---|---|---|---|---|---|
| 0 | 3 | 011 | 0 | 4 | 1000 | 0.7675 |
| 35 | 0 | - | 0 | 5 | 10001 | 1.0000 |

STATE 15:
| NXT STATE | NUM | OUTPUT | NXT | NUM | OUTPUT | THRESHOLD |
|---|---|---|---|---|---|---|
| 1 | 1 | 0 | 28 | 0 | - | 0.7255 |
| 0 | 1 | 0 | 1 | 3 | 100 | 1.0000 |

STATE 16:
| NXT STATE | NUM | OUTPUT | NXT | NUM | OUTPUT | THRESHOLD |
|---|---|---|---|---|---|---|
| 0 | 1 | 0 | 6 | 1 | 1 | 0.6585 |
| 1 | 0 | - | 4 | 2 | 11 | 0.8348 |
| 2 | 0 | - | 2 | 3 | 111 | 0.9341 |
| 4 | 0 | - | 1 | 4 | 1111 | 1.0000 |

STATE 17:
| NXT STATE | NUM | OUTPUT | NXT | NUM | OUTPUT | THRESHOLD |
|---|---|---|---|---|---|---|
| 9 | 2 | 10 | 13 | 0 | - | 0.6982 |
| 26 | 0 | - | 0 | 5 | 10111 | 1.0000 |

STATE 18:
| NXT STATE | NUM | OUTPUT | NXT | NUM | OUTPUT | THRESHOLD |
|---|---|---|---|---|---|---|
| 0 | 1 | 0 | 5 | 1 | 1 | 0.7675 |
| 1 | 0 | - | 1 | 3 | 110 | 1.0000 |

STATE 19:
| NXT STATE | NUM | OUTPUT | NXT | NUM | OUTPUT | THRESHOLD |
|---|---|---|---|---|---|---|
| 0 | 1 | 0 | 4 | 2 | 10 | 0.7675 |
| 3 | 0 | - | 2 | 3 | 101 | 0.9004 |
| 5 | 0 | - | 1 | 4 | 1011 | 1.0000 |

STATE 20:
| NXT STATE | NUM | OUTPUT | NXT | NUM | OUTPUT | THRESHOLD |
|---|---|---|---|---|---|---|
| 0 | 4 | 0111 | 0 | 5 | 10000 | 1.0000 |

STATE 21:
| NXT STATE | NUM | OUTPUT | NXT | NUM | OUTPUT | THRESHOLD |
|---|---|---|---|---|---|---|
| 0 | 2 | 01 | 0 | 2 | 10 | 0.5764 |
| 17 | 0 | - | 1 | 2 | 01 | 0.7255 |
| 23 | 0 | - | 9 | 3 | 101 | 0.8348 |
| 37 | 0 | - | 0 | 4 | 1011 | 1.0000 |

STATE 22:
| NXT STATE | NUM | OUTPUT | NXT | NUM | OUTPUT | THRESHOLD |
|---|---|---|---|---|---|---|
| 2 | 1 | 1 | 0 | 2 | 01 | 0.6982 |
| 21 | 0 | - | 1 | 2 | 11 | 1.0000 |

STATE 23:
| NXT STATE | NUM | OUTPUT | NXT | NUM | OUTPUT | THRESHOLD |
|---|---|---|---|---|---|---|
| 0 | 2 | 01 | 3 | 2 | 10 | 0.7255 |
| 32 | 0 | - | 33 | 2 | 10 | 1.0000 |

STATE 24:
| NXT STATE | NUM | OUTPUT | NXT | NUM | OUTPUT | THRESHOLD |
|---|---|---|---|---|---|---|
| 3 | 1 | 1 | 0 | 2 | 01 | 0.7675 |
| 21 | 0 | - | 0 | 4 | 1100 | 1.0000 |

FIG_16D2

|  | MPS | | | LPS | | |
| NXT STATE | NUM | OUTPUT | NXT | NUM | OUTPUT | THRESHOLD |
| --- | --- | --- | --- | --- | --- | --- |
| STATE 25: | | | | | | |
| | 1 | 1 | 0 | 45 | 0 | - | 0.7255 |
| | 0 | 1 | 0 | 2 | 3 | 100 | 0.8742 |
| | 11 | 0 | - | 1 | 4 | 1001 | 1.0000 |
| STATE 26: | | | | | | |
| | 12 | 2 | 10 | 13 | 0 | - | 1.0000 |
| STATE 27: | | | | | | |
| | 0 | 1 | 0 | 16 | 1 | 1 | 0.6585 |
| | 1 | 0 | - | 6 | 2 | 11 | 0.8348 |
| | 2 | 0 | - | 4 | 3 | 111 | 0.9341 |
| | 6 | 0 | - | 1 | 5 | 11111 | 1.0000 |
| STATE 28: | | | | | | |
| | 0 | 3 | 011 | 1 | 3 | 100 | 1.0000 |
| STATE 29: | | | | | | |
| | 4 | 1 | 1 | 0 | 2 | 01 | 0.6982 |
| | 21 | 0 | - | 2 | 2 | 11 | 0.7675 |
| | 24 | 0 | - | 12 | 2 | 11 | 0.7947 |
| | 12 | 0 | - | 1 | 3 | 111 | 1.0000 |
| STATE 30: | | | | | | |
| | 0 | 1 | 0 | 7 | 1 | 1 | 0.7255 |
| | 7 | 0 | - | 26 | 1 | 1 | 0.8348 |
| | 1 | 0 | - | 2 | 3 | 110 | 0.9341 |
| | 8 | 0 | - | 1 | 4 | 1101 | 1.0000 |
| STATE 31: | | | | | | |
| | 0 | 1 | 0 | 11 | 1 | 1 | 0.7675 |
| | 5 | 0 | - | 14 | 1 | 1 | 0.9004 |
| | 7 | 0 | - | 13 | 1 | 1 | 1.0000 |
| STATE 32: | | | | | | |
| | 14 | 0 | - | 0 | 3 | 010 | 0.6585 |
| | 1 | 2 | 01 | 13 | 0 | - | 0.6982 |
| | 0 | 2 | 01 | 0 | 4 | 1000 | 1.0000 |
| STATE 33: | | | | | | |
| | 0 | 2 | 01 | 0 | 3 | 100 | 1.0000 |
| STATE 34: | | | | | | |
| | 0 | 4 | 0111 | 1 | 4 | 1000 | 1.0000 |
| STATE 35: | | | | | | |
| | 20 | 0 | - | 0 | 4 | 0110 | 1.0000 |
| STATE 36: | | | | | | |
| | 13 | 0 | - | 21 | 2 | 10 | 0.6080 |
| | 1 | 2 | 10 | 0 | 4 | 0111 | 1.0000 |
| STATE 37: | | | | | | |
| | 0 | 2 | 01 | 1 | 2 | 10 | 0.6585 |
| | 32 | 0 | - | 21 | 2 | 10 | 0.7947 |
| | 33 | 0 | - | 0 | 4 | 1010 | 1.0000 |
| STATE 38: | | | | | | |
| | 5 | 1 | 1 | 0 | 2 | 01 | 0.6585 |
| | 33 | 0 | - | 37 | 1 | 1 | 0.7255 |
| | 21 | 0 | - | 1 | 3 | 110 | 1.0000 |
| STATE 39: | | | | | | |
| | 0 | 1 | 0 | 6 | 2 | 10 | 0.7255 |
| | 11 | 0 | - | 29 | 2 | 10 | 0.7947 |
| | 3 | 0 | - | 4 | 3 | 101 | 0.9004 |
| | 5 | 0 | - | 2 | 4 | 1011 | 0.9557 |
| | 7 | 0 | - | 1 | 5 | 10111 | 1.0000 |
| STATE 40: | | | | | | |
| | 23 | 0 | - | 0 | 2 | 00 | 0.6585 |
| | 0 | 1 | 0 | 3 | 2 | 10 | 0.8348 |
| | 11 | 0 | - | 33 | 2 | 10 | 0.9004 |
| | 15 | 0 | - | 10 | 2 | 10 | 1.0000 |

FIG_16D3

|  | MPS | | | LPS | | | |
|---|---|---|---|---|---|---|---|
| NXT STATE | NUM | OUTPUT | | NXT | NUM | OUTPUT | THRESHOLD |

STATE 41:
| NXT | NUM | OUTPUT | | NXT | NUM | OUTPUT | THRESHOLD |
|---|---|---|---|---|---|---|---|
| 9 | 1 | 1 | | 10 | 0 | - | 0.6982 |
| 42 | 0 | - | | 0 | 4 | 1111 | 1.0000 |

STATE 42:
| NXT | NUM | OUTPUT | | NXT | NUM | OUTPUT | THRESHOLD |
|---|---|---|---|---|---|---|---|
| 12 | 1 | 1 | | 10 | 0 | - | 1.0000 |

STATE 43:
| NXT | NUM | OUTPUT | | NXT | NUM | OUTPUT | THRESHOLD |
|---|---|---|---|---|---|---|---|
| 0 | 1 | 0 | | 5 | 2 | 10 | 0.7947 |
| 11 | 0 | - | | 37 | 2 | 10 | 0.8742 |
| 25 | 0 | - | | 36 | 2 | 10 | 0.9004 |
| 3 | 0 | - | | 1 | 4 | 1010 | 1.0000 |

STATE 44:
| NXT | NUM | OUTPUT | | NXT | NUM | OUTPUT | THRESHOLD |
|---|---|---|---|---|---|---|---|
| 13 | 0 | - | | 33 | 2 | 10 | 1.0000 |

STATE 45:
| NXT | NUM | OUTPUT | | NXT | NUM | OUTPUT | THRESHOLD |
|---|---|---|---|---|---|---|---|
| 0 | 3 | 011 | | 2 | 3 | 100 | 0.6585 |
| 35 | 0 | - | | 12 | 3 | 100 | 0.7255 |
| 14 | 0 | - | | 1 | 4 | 1001 | 1.0000 |

STATE 46:
| NXT | NUM | OUTPUT | | NXT | NUM | OUTPUT | THRESHOLD |
|---|---|---|---|---|---|---|---|
| 1 | 1 | 0 | | 35 | 0 | - | 0.7675 |
| 2 | 1 | 0 | | 20 | 0 | - | 1.0000 |

STATE 47:
| NXT | NUM | OUTPUT | | NXT | NUM | OUTPUT | THRESHOLD |
|---|---|---|---|---|---|---|---|
| 35 | 0 | - | | 0 | 3 | 010 | 0.6080 |
| 1 | 2 | 01 | | 20 | 0 | - | 1.0000 |

STATE 48:
| NXT | NUM | OUTPUT | | NXT | NUM | OUTPUT | THRESHOLD |
|---|---|---|---|---|---|---|---|
| 0 | 2 | 01 | | 2 | 2 | 10 | 0.6585 |
| 32 | 0 | - | | 12 | 2 | 10 | 0.7675 |
| 33 | 0 | - | | 1 | 3 | 101 | 0.8348 |
| 23 | 0 | - | | 21 | 3 | 101 | 1.0000 |

STATE 49:
| NXT | NUM | OUTPUT | | NXT | NUM | OUTPUT | THRESHOLD |
|---|---|---|---|---|---|---|---|
| 0 | 4 | 0111 | | 0 | 6 | 100000 | 1.0000 |

STATE 50:
| NXT | NUM | OUTPUT | | NXT | NUM | OUTPUT | THRESHOLD |
|---|---|---|---|---|---|---|---|
| 0 | 1 | 1 | | 9 | 1 | 0 | 0.6585 |
| 41 | 0 | - | | 21 | 1 | 0 | 0.7675 |
| 9 | 0 | - | | 0 | 3 | 001 | 1.0000 |

STATE 51:
| NXT | NUM | OUTPUT | | NXT | NUM | OUTPUT | THRESHOLD |
|---|---|---|---|---|---|---|---|
| 34 | 0 | - | | 0 | 4 | 0110 | 0.6585 |
| 0 | 3 | 011 | | 1 | 4 | 1000 | 1.0000 |

STATE 52:
| NXT | NUM | OUTPUT | | NXT | NUM | OUTPUT | THRESHOLD |
|---|---|---|---|---|---|---|---|
| 2 | 1 | 1 | | 9 | 1 | 0 | 0.6585 |
| 42 | 0 | - | | 21 | 1 | 0 | 1.0000 |

STATE 53:
| NXT | NUM | OUTPUT | | NXT | NUM | OUTPUT | THRESHOLD |
|---|---|---|---|---|---|---|---|
| 22 | 2 | 10 | | 13 | 0 | - | 0.6585 |
| 52 | 2 | 10 | | 20 | 0 | - | 0.6982 |
| 4 | 2 | 10 | | 0 | 4 | 0111 | 0.8742 |
| 36 | 0 | - | | 1 | 4 | 1011 | 1.0000 |

STATE 54:
| NXT | NUM | OUTPUT | | NXT | NUM | OUTPUT | THRESHOLD |
|---|---|---|---|---|---|---|---|
| 22 | 1 | 1 | | 10 | 0 | - | 0.6585 |
| 52 | 1 | 1 | | 14 | 0 | - | 0.7255 |
| 4 | 1 | 1 | | 0 | 3 | 011 | 1.0000 |

STATE 55:
| NXT | NUM | OUTPUT | | NXT | NUM | OUTPUT | THRESHOLD |
|---|---|---|---|---|---|---|---|
| 0 | 1 | 0 | | 8 | 1 | 1 | 0.6585 |
| 3 | 0 | - | | 24 | 1 | 1 | 0.7675 |
| 1 | 0 | - | | 3 | 2 | 11 | 0.8742 |
| 18 | 0 | - | | 10 | 2 | 11 | 1.0000 |

FIG_16D4

| | MPS | | | | LPS | | |
|---|---|---|---|---|---|---|---|
| NXT STATE | NUM | OUTPUT | | NXT | NUM | OUTPUT | THRESHOLD |
| STATE 56: | | | | | | | |
| | 0 | 1 | 0 | 27 | 1 | 1 | 0.6585 |
| | 1 | 0 | - | 16 | 2 | 11 | 0.8348 |
| | 2 | 0 | - | 6 | 3 | 111 | 0.9004 |
| | 55 | 0 | - | 29 | 3 | 111 | 0.9341 |
| | 4 | 0 | - | 4 | 4 | 1111 | 0.9557 |
| | 6 | 0 | - | 2 | 5 | 11111 | 0.9756 |
| | 16 | 0 | - | 1 | 6 | 111111 | 1.0000 |
| STATE 57: | | | | | | | |
| | 1 | 2 | 10 | 50 | 3 | 011 | 1.0000 |
| STATE 58: | | | | | | | |
| | 0 | 2 | 10 | 9 | 3 | 011 | 1.0000 |
| STATE 59: | | | | | | | |
| | 0 | 1 | 0 | 15 | 1 | 1 | 0.7675 |
| | 5 | 0 | - | 28 | 1 | 1 | 0.9004 |
| | 1 | 0 | - | 1 | 4 | 1100 | 1.0000 |
| STATE 60: | | | | | | | |
| | 37 | 0 | - | 54 | 1 | 1 | 0.5764 |
| | 6 | 1 | 1 | 0 | 2 | 01 | 0.7255 |
| | 24 | 0 | - | 22 | 2 | 11 | 0.7675 |
| | 38 | 0 | - | 42 | 2 | 11 | 0.7947 |
| | 12 | 0 | - | 2 | 3 | 111 | 0.9004 |
| | 22 | 0 | - | 1 | 4 | 1111 | 1.0000 |
| STATE 61: | | | | | | | |
| | 11 | 1 | 1 | 0 | 2 | 01 | 0.6585 |
| | 33 | 0 | - | 32 | 1 | 1 | 0.7675 |
| | 37 | 0 | - | 14 | 1 | 1 | 0.8742 |
| | 48 | 0 | - | 13 | 1 | 1 | 1.0000 |

FIG_16D5

METHOD AND APPARATUS FOR USING FINITE STATE MACHINES TO PERFORM CHANNEL MODULATION AND ERROR CORRECTION AND ENTROPY CODING

This application is a continuation-in-part application of U.S. patent application Ser. No. 07/931,156 entitled "Method And Apparatus For Entropy Coding, filed Aug. 17, 1992, now U.S. Pat. No. 5, 272,478.

FIELD OF THE INVENTION

The present invention relates to the field of data compression; particularly, the present invention relates to the field of binary entropy coders and their use in conjunction with channel modulation and forward error correction.

BACKGROUND OF THE INVENTION

Data compression is an extremely useful tool for storing and transmitting large amounts of data. For example, the time required to transmit an image, such as a facsimile transmission of a document, is reduced drastically when compression is used to decrease the number of bits required to transmit the image. Many different data compression techniques exist in the prior art.

Every compression system is associated with a corresponding decompression system. The implementation of a decompression system can normally be inferred from the compression system. The algorithm used by the compression system to effectuate encoding must be either transmitted as part of the compressed document or inferable by the decompression system.

More specifically, in entropy coding, a sequence of "input" symbols $<t_1 t_2 t_3 \ldots, t_m>$, which are typically data samples or quantized error values, can be replaced deterministically with a sequence of "outputs" codewords $<s_1, s_2, s_3, \ldots, s_n>$ as a function of time:

$$f(\bar{t}) = (\bar{s}) = <s_1, s_2, \ldots s_n>$$

such that a deterministic inverse (reconstruction) function exists:

$$f^{-1}(\bar{s}) = (\bar{t}), \text{ for all } \{t\}, \{s\} = f(\{t\})$$

This type of entropy code f may be built from a set of instantaneous production rules. The result of applying each of these rules is the generation of an ordered sequence of zero or more output tokens. However, the number of output tokens is usually one or more.

In some compression systems, an input file or set of data is translated into a sequence of decisions under the direction of a decision model. Each decision has an associated likelihood, and based on this likelihood, an output code is generated and appended to the compressed file. To implement these encoding systems, the compression systems have three parts: a decision model, a probability estimation method and a bit-stream generator. The decision model receives the input data and translates the data into a set of decisions which the compression system uses to encode the data. The probability estimation method is the procedure for developing the estimate for the likelihood of each decision. The bit-stream generator performs the final bit-stream encoding to generate the output code that is the compressed data set or compressed file. Compression can effectively occur in either or both the decision model and the probability estimation method.

One compression technique widely employed is arithmetic coding. Arithmetic coding maps a string of data (i.e., a "message") to a code string in such a way that the original message can be recovered from the code string wherein the encoding and decoding algorithms perform arithmetic operations on the code string. For a discussion on arithmetic coding see, Glenn G. Langdon, Jr., "An Introduction to Arithmetic Coding", *IBM Journal of Research and Development*, vol. 28, no. 2, (March 1984).

In arithmetic coding, the code representative of a message is represented by an interval of numbers between 0 and 1. As the number of symbols in the message increases, the interval representing it becomes smaller and the number of bits needed to specify that interval increases. Initially, the interval for the message is between zero and one [0,1). As each symbol of the message is processed, the interval is narrowed in accordance with the symbol probability.

For example, referring to FIG. 1a, the symbols (in this instance, text) z, y, x, w, v, u are assigned the probabilities 0.2, 0.3, 0.1, 0.2, 0.1, 0.1. The probabilities are then mapped to the range of [0,1.0) resulting in the ranges identified in FIG. 1a. Referring to FIG. 1a, the symbol z is allocated the range [0,0.2) reflecting the probability of 0.2 and the symbol u is allocated the range of 0.9, 1.0) reflecting the high end of the probability range of symbols and the u probability of 0.1.

In order for compression to be possible, the symbols which occur more frequently are assigned a greater probability value. Once the probability ranges are allocated, the symbols may be encoded for compression. The initial range or interval is set to [0,1). After the occurrence of the first symbol of the message to be compressed, the range is narrowed in proportion to that symbol's probability. Referring to FIG. 1a, the range [0,1) is first illustrated. After the occurrence of the symbol y, the range is decreased to a new interval of size proportional to the probability of y. In other words, instead of the range or interval being set to its initial values, the range is set according to the probability of the symbol which just occurred. Since the probability of y is 0.3 and has a range of [0.2, 0.5), the updated range from which the encoding occurs is [0.2, 0.5), such that the probability of occurrence of the next symbol includes the influence of the probabilities of the symbols which came before it (i.e., y). Thus, all of the probabilities for the symbols total a range from 0.2 to 0.5 instead of 0 to 1 as before the occurrence of the symbol y. Similarly, after the occurrence of the next symbol z, which has the probability of 0.2 and the range [0, 0.2) the interval is decreased in proportion to the z probability to [0.2, 0.26), such that the range of probabilities for the next symbol is taken from the interval 0.2 to 0.26, with the influence of both the previous y and z symbols taken into account.

In decoding, since the size of the interval used in the encoding process is indicative of the probability range of a symbol in group of symbols, the symbols can be easily extracted, using the ranges for each symbol that were utilized in encoding. For example, if the final interval was [0.23, 0.236), one can determine that the first symbol is y because the final interval lies completely within the range of y [0.2, 0.5). Using the same process as the encoder, after seeing y, the initial interval [0, 1) is updated to be [0.2, 0.5) and the updated range of a [0.2, 0.26) encompasses the final interval [0.23, 0.236). This process continues until all symbols are decoded.

A binary arithmetic coder is one type of an arithmetic coding system. In a binary arithmetic coding system, the selection of a symbol from a set of symbols can be encoded as a sequence of binary decisions. An example of a binary arithmetic coder is the "Q-coder" developed at International Business Machines, Armonk, N.Y. The Q-coder utilizes fixed precision arithmetic and a renormalization process wherein the code string and interval are renormalized as necessary in order to maintain the values within the bounds allowed by fixed-precision representation. In addition, to avoid the need to perform a multiplication operation to scale the interval to reflect the coding of a symbol, an approximation is utilized in place of the multiplication. In the prior art, a compressed bit-stream is often characterized as being sent over a lossless bandwidth limited channel. The compressed bit-stream is then received and decoded. However, channels, in reality, are usually not lossless. Therefore, some form of error correction encoding and some sort of channel modulation are performed. In the prior art, these are separate operations.

Another commonly used set of codes are referred to as constrained channel codes. One type of channel codes are run length limited (RLL) codes. RLL codes are often used in the disk drive industry, particularly when raw data is being written to a magnetic track. Codes having very similar characteristics to RLL codes are also used for digital magnetic tape, CD-ROMs, optical disks, and even fiber optic cables. In these cases, a group of arbitrary binary digits is converted to a longer sequence of binary digits with some constraints on the pattern of allowable one and zero bits. For the basic RLL codes, the constraint is that a '1' bit is always followed by at least d '0' bits and at most k '0' bits. Codes following such a format are commonly referred to as RLL (d,k) codes. For instance, a code having a 1 followed by at least 1 '0' bit and at most 7 '0' bits is referred to as an RLL (1,7) code. Such a code is described in U.S. Pat. No. 4,413,251, entitled "Method and Apparatus for Generating a Noiseless Sliding Block Code for a (1,7) Channel with Rate ⅔", Adler et al. In Adler, reference is also made to (1,8) and (2,7) codes. A widely used RLL code is called Modified Frequency Modulation (MFM). MFM is a RLL (1,3) code and, therefore, creates a sequence where every '1' is followed by at least one zero and at most three zeros. Use of these constrained channel codes is universal and actually allows more information to be stored on a disk.

Channel codes being used in channel modulation produce outputs at a fixed rate. In other words, an encoder implementing such a code receives a fixed number of arbitrary input bits and produces a fixed larger number of constrained bits. Because the prior art is limited to outputting only fixed length output bit streams, these channel codes do not use all possible constrained sequences. Thus, it is advantageous to provide codes that make use of more output code streams while being technological feasible.

The functions of data compression and channel modulation are both required in the performance of some applications. However, these functions are implemented with separate units in the prior art. This requires extra hardware and may require extra resources. Thus, it would be advantageous to implement the functions of data compression and channel coding in the same functional unit simultaneously to reduce the hardware required.

In addition to being compressed, data is often encoded to allow error correction after transmission over a noisy channel. Noise occurs in virtually any digital channel, including satellite links and disk drives. In error correction coding, a previously arbitrary bit stream is expanded in a way which meets constraints that make it possible to detect and correct errors in the bit stream. This is similar to the coding done for the run length limited channels, although the constraint is different. The functions of error correction and data compression are also usually implemented by separate functional units. Thus, it is advantageous to have the data compression and error correction performed simultaneously by the same functional unit as a means to reduce the required hardware.

As will be shown, the present invention provides a binary entropy coder that uses a decision model which produces decisions which are always two-valued (i.e., yes or no). The present invention also employs output tokens which are not fixed-length bit strings. In particular, the present invention encodes most decisions with less than one bit.

The present invention also provides a finite state machine to perform channel coding. Another finite state machine of the present invention performs error correction coding. It is also possible to perform channel coding and compression with one finite state machine.

SUMMARY OF THE INVENTION

It is an object of the present invention to provide a binary coder that is efficient and simple to implement.

The present invention provides a simple, inexpensive encoding and decoding apparatus and method for the compression and expansion of data which is represented by binary decisions. The present invention includes a state machine having a plurality of states. Each state has at least one transition pair. Each element of the transition pair causes zero or more bits representative of the code to be output and the identification of the next state to which to proceed. The transition pair reflects an output for a yes and no response associated with the probability of the data to be compacted and whether the data falls within that probability.

The present invention also includes an apparatus and method for searching the transition pairs in the current state of the state machine according to the probability value. According to the probability estimate, the present invention outputs zero or more bits and transitions to the next state.

The present invention includes an apparatus and method for performing channel coding, error correction or both using a finite state machine. The finite state machine of the present invention may be designed to perform channel modulation and data compression simultaneously, error correction and data compression simultaneously, or error correction, channel modulation and data compression simultaneously.

BRIEF DESCRIPTION OF THE DRAWINGS

The present invention will be understood more fully from the detailed description given below and from the accompanying drawings of the preferred embodiments of the invention, which, however, should not be taken to limit the invention to the specific embodiments, but are for explanation and understanding only.

FIG. 1a and 1b illustrate the prior art method of arithmetic coding.

FIG. 2 is an exemplary block diagram of an entropy encoder and decoder of a preferred embodiment of the present invention.

FIG. 3 is a block diagram representation of another embodiment of the present invention.

FIG. 4 illustrates the encoder for performing channel coding according to the present invention.

FIG. 5 illustrates one embodiment of the encoder for performing channel coding according to the present invention.

FIG. 6 is a block diagram of one embodiment of a recording system of the present invention.

FIG. 7 illustrates one embodiment of the encoder of performing channel coding and data compression simultaneously.

FIG. 8 is an example of a finite state transition diagram.

FIG. 9 is a flow chart illustrating the table generation process of the present invention. FIG. 10 is a flow chart illustrating the process for generating an initial finite state diagram.

FIG. 11 is a flow chart depicting one embodiment of the process for improving the initially generated finite state diagram according to the present invention.

FIG. 12 illustrates an example finite state transition diagram for run-length limited channels.

FIG. 13A illustrates a finite state diagram created according to the generation method of the present invention.

FIG. 13B represents the finite state diagram shown in FIG. 13A with transitions for another probability added. FIG. 14 illustrates a finite state transition diagram. FIG. 15 illustrates a finite state transition diagram that is created according to the state machine generation method of the present invention.

FIG. 16A–16D are examples of transition matrices created using the process of the present invention.

DETAILED DESCRIPTION OF THE INVENTION

A method and apparatus for coding binary decisions is described. Also, a method and apparatus for performing channel modulation and for error correction is described. In the following description, numerous specific details are set forth, such as specific numbers of bits, tokens, etc., in order to provide a thorough understanding of the preferred embodiment of the present invention. It will be obvious to one skilled in the art that the present invention may be practiced without these specific details. Also, well known circuits have been shown in block diagram form, rather than in detail, in order to avoid unnecessarily obscuring the present invention.

FIG. 2 is a block diagram illustration of a system for the compression and decompression of data utilized by the present invention. Data 100 is input into the binary decision model (BDM) 110. BDM 110 translates the input data stream (e.g., an input file) into a set or sequence of binary decisions. It should be noted that the data model used by the present invention expresses all events as binary decisions. BDM 110 also provides a context for each binary decision.

Both the sequence of binary decisions and their associated context are output from BDM 110 to probability estimation module (PEM) 115. PEM 115 utilizes the context to generate a probability estimate for each binary decision. The actual probability estimate is represented by a class, referred to as PClass. Each PClass is used for a range of probabilities. In the present invention, each PClass in used for a range of probabilities instead of using several bits to specify an exact number probability. In this manner, only a few bits are needed to specify which class range the probability is in. In one embodiment, every binary decision is phrased so that it is likely at least 50 percent of the time. This ensures that all probability classes used by the coder of the present invention are probabilities greater than or equal to 50 percent. That is, the probability classes are for probabilities greater than fifty percent. PEM 115 also determines whether the binary decision (result) is or is not in its more probable state. Both the probability estimate (PClass) and the determination of whether the binary decision was likely or not produced by PEM 115 are output to coder 120. After passing the PClass to coder 120, PEM 115 can update its probability estimate for the given context.

Coder 120 is coupled to receive inputs of the probability class regarding the probability of occurrence of the input binary decisions and a bit indicating whether or not the probable event occurred. In response, coder 120 produces a compressed data stream representing the original data 100. Coder 120 outputs zero or more bits with each input. This compressed data may be transmitted across a network or other data link (e.g., communications line) or simply stored in memory. For example, the compressed data 125 may be utilized to transmit images between facsimile machines.

The reverse process is executed to decompress the data, such that the original input data 100 may be reconstructed (to some extent). Note that the result from PEM 135 is exactly the same as the result given to PEM 115. The original data 100 can be reconstructed exactly or approximately depending on BDM 110 and 140. Decoder (codec) 130 is coupled to receive the compressed output 125. BDM 140 provides a context to PEM 135. PEM 135 is coupled to receive the context from BDM 140. Based on the context, PEM 135 provides a probability class to coder 130. Coder 130 is coupled to receive the probability class from PEM 135. In response to the probability class and the compressed data 125, coder 130 outputs a bit representing whether the binary decision is in its probable state. In other words, coder 130 returns a bit indication, the occurrence of the likely event. PEM 135 is coupled to receive the bit from coder 130 and uses the bit to update the probability estimates based on the received bit. PEM 135 also returns the result to BDM 140. BDM 140 is coupled to receive the returned bit and uses the returned bit to generate the original data 100 and update the context for the next binary decision.

In FIG. 2, the BDM and PEM for both the encoder 120 and decoder 130 provide an apparatus and a method for understanding the data and for developing useful probability estimates. It should be noted that many approaches exist to provide probability estimation and the present invention is not restricted to using any particular probability estimation mechanism. For example, in image compression, the probability could be determined according to a 5-pel prediction method wherein five previously processed pixel values ("X") are used to estimate another pixel value, A, as shown below.

```
    XX
   XXXA
```

This can be accomplished by maintaining 32 probability estimates (i.e., $2^5$ where 5 is the number of previous pixels) and selecting the appropriate estimate based on the actual "context" (i.e., the five previous processed pixel values). The individual probability estimates may be updated whenever their individual context is encountered. In one embodiment, the estimates are updated every decision. The bitstream generator may be combined with the probability estimation machine into a single table lookup. The only requirement of the present invention is that the input to the bit generator is a binary decision and a probability. In other words, the input to the encoder is only decision pairs (e.g., yes/no decisions) or any other substitute two code arrangement.

In implementing this specific restriction, where all possible decisions occur in pairs, both decisions have probabilities associated with them. For instance, in the case of yes/no decisions, a "yes" has a probability P, while a "no" has a probability (1-P). These probabilities are usually stored and accessed in a table. In practice, the size of the estimation table may be cut in half by remembering solely the more probable state of each context. In other words, the pair (P, X), where X is "yes" or "no" and P is a probability between 0 and 1, may be replaced with the pair (P', W) where W is "likely" or "unlikely" and P' is between 0.5 and 1. This is the approach taken in the currently preferred embodiment of the coder of the present invention where the probability estimates received from the PEM 115 and PEM 135 by coder 120 and decoder 130 respectively represent probability estimates for the most probable state (i.e., probabilities greater than 50 percent). It should be noted that for the purposes of the following discussion the terms likely and unlikely will be used interchangeably with the "yes" (Y) and "no" (N) designations and "MPS" and "LPS" for the most probable symbol and the least probable symbol.

The binary entropy coding system of the present invention comprises a transition machine having multiple states, where each of the states has one or more pairs of legal transitions. Each transition is defined to cause a string of zero or more bits to be emitted when the transition occurs and a destination state to which the transition machine transfers during transition. It is from this destination state that the transition machine continues processing of the next symbol. In the present invention, PEM 115 determines which transition pair in any particular state is taken. In the currently preferred embodiment, PEM 115 (or 135) determines the selection of one of the pairs of legal transitions from the current state by outputting probability estimates to coder 120 (or decoder 130). The Y/N input from BDM 110 determines which of the two legal transitions of the selected pair is made during encoding. Ultimately, coder 120 outputs its bit stream which represents the compressed input data according to the Y/N input from the BDM and the probability estimates from PEM 115. During decoding, the bit values in the bit stream of the compressed bit stream determine which of the two legal transitions from the selected pair is made.

Each of the states can be described as a set of legally emittable bit streams. With the emitted bits properly prepended, each of the transitions of the machine can also be described as such a set. For each transition pair employed in the coder and decoder, the transition pairs are disjoint and have a union equal to the set corresponding to the state. In the present invention, the union of the set is all possible binary outputs. The probability range associated with each transition pair is chosen to produce a low bit rate encoding of the binary decisions.

Coder 120 receives the probability associated with the symbol to be encoded (i.e., the probability estimates) and the Y/N signal indicating whether the data to be encoded is or is not within that probability range indicated by the probability estimate output by the probability estimation model (i.e., whether the data is in its more probable state). With this information coder 120 outputs a string of bits representative of the symbol to be encoded, the bit string being a compressed form of the symbol.

One embodiment of the present invention is shown below in Table 1.

TABLE 1

|  |  | P1 $0.50 \leq P < 0.64$ | | P2 $0.64 \leq P < 1$ | |
| --- | --- | --- | --- | --- | --- |
| S0 | Y | 0 | S0 | — | S1 |
|  | N | 1 | S0 | 11 | S0 |
| S1 | Y | 0 | S0 | 0 | S0 |
|  | N | 10 | S0 | 10 | S0 |

Referring to Table 1, a two-state coder is shown. Initially, the coder is in state S0. The coder (e.g., coder 120 in FIG. 2) receives a series of probability classes (e.g., PC1, PC2, PC3, PC4, . . . ) and likely (MPS, LPS, MPS, MPS) or (Y, N, Y, Y) from the probability estimation model (e.g., PEM 115 in FIG. 2) which cause the coder to output a bit sequence of zero or more bits and possibly transition to another state. The probability classes indicate to the coder which column should be used. In this example, the probability class indicates whether the coder should use column P1 or P2. For example, if the two-state coder received the sequence of probability estimates<P1, P2, P2, P2> and the sequence of Y/N decisions (Y, Y, Y, N) (i.e., likely or not) as inputs, the coder would initially receive the first input (P1) and select the first column ("0.50<P<0.64") of the first row (S0) and encounter the response "0 S0". In this case, a "0" is output and the state register remains in state S0. The second input to the coder (P2) causes the second column to be selected ("0.64<P<1") in the first row (S0). In response, the coder does not output any bits (shown as "-") and the state register transitions to state S1 (as depicted in the column). Similarly, the third input (P2) selects the second column of the third row (S2) causing a "0" to be output and causing the state register to transition to state S0. Lastly, the fourth input (P2) causes the second column to be selected in the second row (S0), wherein a "11" is output and the state register remains in state S0. Therefore, the sequence of four probability estimates (i.e., the four decisions) produced four bits of output ("0011") even though the correspondence was not one-to-one. Though this example did not produce any compression in the number of symbols encoded, if the two-state coder received 20 consecutive cases of probability P=0.7 with 20 consecutive Y decisions, the output would have been ten "0"s, thereby providing a 2-to-1 compression.

As illustrated in FIG. 2, the Y/N response is an input to the probability estimation model (PEM) which then outputs binary decisions to the data model which, in turn, outputs the data representing the decompressed version of the input data.

FIG. 3 illustrates another embodiment of a coder and decoder implemented in accordance with the present invention. In this embodiment, two memories are used to store two look-up tables (e.g., transition state machine, transition tables) utilized in the coding and decoding process respectively (referred to in FIG. 3 as ROM 300 and 310 respectively). These memories are used to select the transitions and control the compression and decompression of data. Referring to FIG. 3, the Y/N decision 315, probability 320 from the statistics model (FIG. 2) and the state of the coder 325, as maintained by the state register 330, are input to the ROM 300 to select the proper output consisting of the compressed data bit stream and an identification of the next state. For decompression, the compressed data from data register 370, the probability 320 and the state of the coder are input as indices to the look-up table in ROM 310 which, in response, outputs the Y/N decision 380 and the identification of the next state.

As this circuit performs both compression and decompression, a compression enable signal line 335 and decompression enable signal line 340 are utilized to select the functionality of the circuit. Thus, when the circuit is to perform compression, compression enable line 335 is actuated to enable the ROM 300 and when decompression is to be performed the decompression enable line 340 is activated to enable ROM 310.

During the compression sequence, ROM 300 receives the Y/N value 315, probability 320 and state register state 325 and outputs the new state 350 which is then stored in the state register 330, a count of the number of bits output as compressed data 355 and the compressed data 360. The compressed data 360 is stored in the data register 370 and the count of bits 355 output by the ROM is used to shift the bits into the data register to receive the compressed data bits output by ROM 300. The compressed data then may then be output to a storage or transmission medium through the data register 370 when desired.

When data is to be decompressed, the data is placed in the data register 370 and read out of the data register as controlled by the shift count signal line 375 and input to the ROM 320 along with the probability 320 and state as maintained by the state register 330. These input values are used to perform a table look-up in the table located in the ROM 310, which outputs Y/N value 380 identifying to the statistics model whether the data value falls within the more probable range. ROM 310 also outputs the number of compressed data bits which is input to the shift count line 375 of the data register 370 to shift the bits located in the data register 370 and the next state 350 of the circuit. As described previously, the Y/N signal generated is input to the remaining components of the decompressor, specifically the statistics model and BDM device, to reconstruct the input data.

FINITE STATE MACHINES

The present invention provides a method and apparatus for performing channel modulation. In one embodiment, the present invention performs channel coding for run-length limited channels. Channel coding is performed using finite state machines. In the present invention, finite state machines are used to track partial outputs while each input is consumed one at a time. The outputs are produced at variable rate in that the length of each output may vary according to the data coded.

The present invention includes a method and apparatus for performing channel coding and data compression by the same functional unit. One application of the binary entropy coder of the present invention is to combine the bit-generation stage of the present invention with the channel modulation to allow both compression and channel modulation to occur simultaneously. In other words, the binary entropy coder of the present invention may be modified to perform some types of channel modulation at the same time as the original operation of bit generation for data compression is being performed. A finite state machine designed according to the present invention may be used to perform the operations simultaneously.

The present invention further applies the use of finite state machines to error correction. That is, a finite state machine may be designed to perform error correction coding. In another application, the binary entropy coder of the present invention is modified to perform error correction simultaneously with the bit generation operation of data compression. Also modifications may be made to the binary entropy coder (e.g., modifications to the finite state machine) to allow error correction and channel modulation to be performed simultaneously with the bit generation operation of data compression.

By having the data compression operation of bit generation combined with the operations of channel modulation and/or error correction coding, the hardware necessary to implement a system having these functions is reduced because a single functional hardware block provides the multiple functions simultaneously. In applications such as data storage, the compression, error correction and channel modulation functions may all be performed by the data storage device transparent to and separate from the software currently being run on the system.

CODING FOR CONSTRAINED CHANNELS

The present invention performs coding for constrained channels (i.e., channel modulation). The present invention receives a fixed number of arbitrary input bits and produces a larger number of constrained bits. In one embodiment, the present invention receives one input bit at a time and produces a variable number of constrained bits.

The channel may be constrained to providing a run-length limited code, such as a (1,3). The present invention may be used for other runlength limited codes, for example, (1,7). The present invention is also applicable to other constraints besides that of run-length limited codes. For instance, fiber optic channels and other types of channels have a charge constraint. Instead of binary constraint (i.e., a '1' and '0'), the channel is limited to being defined by +1 and −1 charges, where the total charge on the channel must remain between some predefined voltage range (e.g., [−2,+3]). Channels that have non-binary symbol, such as morse code (dots and dashes), can also be handled as a constraint.

The present invention performs channel coding, or channel modulation, using finite state machines. The finite state machines of the present invention include multiple states. Each of the states includes a set of transitions that indicates to which of the states the machine is to transition. The decision with respect to which of the transitions of a particular state is to be taken is made according to the input received. In one embodiment, each of the states includes a pair of transitions, wherein the particular transition taken is chosen according to each input. For binary inputs, a '0' selects one transition and a '1' bit input selects the second transition. The present invention is not limited to binary inputs, such that the transitions in a transition pair or set may be selected according to each distinct input (e.g., token, codeword, etc.) received.

Each transition also includes a set of 0 or more output bits which are output upon the selection of the transition. The output bits are the constrained channel bits. In other words, the output bits for the finite state machine are chosen such that the constraint of the channel is met.

An exemplary block diagram of the channel coding logic is shown in FIG. 4. Referring to FIG. 4, input bits 401 are input into encoder logic 400 to produce a variable number of output bits 402. In the present invention, encoder logic 400 comprises a finite state machine. The finite state machine receives both the current state 403 and an input bit 401 and produces 0 or more output bits 402. The finite state machine also generates one or more bits to indicate the next state. The next state output is fed back to be the current state 403 for the next bit input 401. A set of buffers may be used to buffer the output bits 402, the input bits 401 and the state. These buffers are not shown to avoid unnecessarily obscuring the present invention.

A state table depicting the operation of one embodiment of encoder logic 400 is shown in Table 2. Table 2 depicts the state table for an RLL (1,3) code. The RLL (1,3) channel is often used in disk drives, with a different code referred to as the Modified Frequency Modulation (MFM) code. MFM always inputs one bit and outputs two bits.

TABLE 2

State Table for RLL (1,3) Conversion

| State | Input Bit | Next State | Output Bits |
|-------|-----------|------------|-------------|
| 0 | 0 | 0 | 10 |
| 0 | 1 | 1 | — |
| 1 | 0 | 0 | 1000 |
| 1 | 1 | 0 | 100 |

As shown in Table 2, if the encoder is in state 0 and receives an input bit of '0', then the encoder outputs the bit pattern '01'. Note that in this case, the next state is state 0. Therefore, for these inputs, the encoder remains in state 0. If the encoder is in state 0 and receives an input of a '1', then the encoder does not output any bits, as indicated by the '—', and transitions to state 1. Once in state 1, the encoder outputs either a bit stream of '1000' or '100' depending on whether the input bit is a '0' or '1' respectively. In either case, after producing the output bits, the encoder transitions back to state 0.

Upon review of the possible output bit streams, the finite state machine defined by Table 2 meets the constraint of a RLL (1,3) channel code. All of the output bit streams have a '1' followed by at least one zero and not more than three zeros. Thus, using finite state machines operating according to the state table in Table 2, and others similarly designed, the present invention is able to perform channel modulation (i.e., channel coding).

Also, as illustrated in Table 2, the output bits have a variable length, either 0, 2, 3, or 4 bits. Because the present invention has a variable length output, the present invention is able to increase the number of legitimate (i.e., available) sequences that may be used over that of the prior art without too much complexity. For instance, information theory shows that the RLL (1,3) channel requires approximately 1.81 channel bits per arbitrary data bit. Thus, 0.19 channel bits are wasted for every data bit if a fixed rate method, such as MFM, is used. If coding is accomplished using the finite state machine of the present invention, such as the one described in Table 2, it is possible to use only 1.833 channel bits per data bit on average. For example, a 100 Megabyte disk drive which uses MFM coding could store roughly 110 Megabytes by using the state machine of the present invention instead of prior art MFM implementation. (It should be noted that it is possible to approach the limit of 1.81 channel bits per data bit with currently available fixed rate methods, but these methods requires much larger lookup tables leading to more hardware cost.)

The state machine defining the operation of encoder logic 400 is designated such that the outputs to the transitions automatically meet the constraint being applied. In one embodiment, the finite state machine is implemented as a look-up table (LUT). The finite state may be implemented using combinatorial l logic. One possible implementation of the constrained channel coder of the present invention is shown in FIG. 5. Referring to FIG. 5, a look-up table (LUT) 502 is shown receiving a state 507 from state register 501 and outcome 503. LUT 502 may be contained in a memory. It is also possible to use combinational logic in place of the memory. In one embodiment, outcome 503 is a binary value. The binary value may represent either the Most Probable Symbol (MPS) or the Least Probable Symbol (LPS). LUT 502 generates a constrained bit stream, referred to as output 505, in response to the inputs, such that output 505 meets the constraint placed on the channel. LUT 502 also generates output size 506. Output size 506 indicates the number of bits in output 505. This indication may only be an indication as to which bits in the output stream are significant (i.e., which of the bits are actual output). LUT 502 is also responsible for generating the next state 504. Next state 504 is output from LUT 502 and input into state register 501 as the state input for the next bit. Thus, when LUT 502 receives state 507 and outcome 503, output 505, output size 506 and next state 504 are generated. Output 505 and next state 506 are generated typically in the same manner as the output and next state are generated in conjunction with Table 2.

In one embodiment, state register 501 may buffer 2–8 bits; however, state register 501 may be a register of any size. Since outcome 503 is a single bit binary input, LUT 502 receives an input of 3–9 bits. In one embodiment, the output 505 may be up to 14 bits for some constrained channels. Therefore, in order to indicate which bits are significant, output size 506 must be 2–4 bits.

The present invention may perform channel modulation using a number of optional states. The number of states selected is dependent on the channel constraint. For instance, for a RLL (1,3) coded channel, the use of two states accommodates 99% of the channel capacity. However, for a RLL (1,7) coded channel, 18 states would be required to obtain equivalent or greater efficiency. Also different size state machines may be employed. These state machines may receive only one input bit at a time. However, it is possible to look ahead and accommodate more than 1 bit at a time (e.g., 2 bits) using a larger LUT.

The finite state machines of the present invention that may perform channel modulation may be used in dynamic recording systems, such as disk drives storage systems. The present invention is also applicable to systems employing digital magnetic tape, CD-ROMs, optical disks and fiber optic cables. FIG. 6 illustrates an example of a digital recording system. Referring to FIG. 6, system 600 comprises compression encoder 601, error correction encoder 602, modulation encoder 603, data transfer mechanism 604, digital data recording channel 605, data receiving mechanism 606, modulation decoder 607, error correction decoder 608 and compression decoder 609.

Data 610 is received by compression encoder 601 which compresses the data. Error correction encoder 602 is coupled to compression encoder 601 and receives the compressed data. Error correction encoder 602 performs error correction coding on the compressed data. Modulation encoder 603 is coupled to error correction encoder 602 and receives the compressed, error corrected data from error correction encoder 602. In response, modulation encoder 603 performs channel modulation on the data. In the present invention, modulation encoder 603 includes a finite state machine. The output of modulation encoder 603 is received by data transfer mechanism 604 which transfers the data to channel 605. In one embodiment, data transfer mechanism 604 includes a signal generator. Data transfer mechanism 604 may also include a write equalizer. In some embodiments, channel 605 may comprise a disk storage device or storage medium or be a fiber optic channel.

Data receiving mechanism 606 is coupled to channel 605 for receiving data and supplying the data to modulation decoder 607. In one embodiment, data receiving mechanism 606 may include a read equalizer and/or a data detector. Modulation decoder 607 is coupled to receive the data and demodulates the data. In one embodiment, modulation decoder 607 demodulates the data using a finite state machine. The output of modulation decoder 607 is coupled to be received by error correction decoder 608 which performs error correction decoding on the data, thereby extracting the compressed data from the data received from modulation decoder 607. The compressed data is received by compression decoder 609 which decompresses the data to reproduce data 610.

The present invention also provides for performing channel modulation and data compression simultaneously using finite state machines. In the present invention, the data compression system that uses the binary entropy coder of the present invention for bit generation can be modified to encode and decode sequences which meet the channel constraint. A system shown in FIG. 6 may employ this type of finite state machine for compression encoder 601 and modulation encoder 603 (or for compression decoder 609 and modulation decoder 607). Thus, the same functionality used to perform the data compression may perform the channel coding as well.

In the present invention, a finite state machine is designed to perform the bit generation of data compression and channel modulation and includes multiple states. Each of the states includes one or more sets of transitions. In one embodiment, each set includes a pair of transitions. The probability estimation associated with the data compression is used to select which of the transition sets to use while in the selected particular state. The input to be compressed and channel coded is used to select a particular transition (and output bit stream) in a particular set. Thus, by receiving the state, an input and a probability estimation, the finite state machine of the present invention is able to compress the bit stream while performing channel modulation on the bit stream.

A bit generation machine that does compression encoding and channel coding for RLL (1,3) is shown in Table 3. Referring to Table 3, the input column contains a binary value corresponding to either the Most Probable Symbol (MPS) or the Least Probable Symbol (LPS). The skew represents the probability estimation and refers to how likely the MPS is to occur.

TABLE 3

| Data Compression and Constrained Channel Coding | | | | |
|---|---|---|---|---|
| State | Skew | Input | Next State | Output |
| 0 | Low | LPS | 0 | 10 |
|   |   | MPS | 1 | — |
|   | High | LPS | 0 | 1000 |
|   |   | MPS | 2 | — |
| 1 | Low or High | LPS | 0 | 1000 |
|   |   | MPS | 0 | 100 |
| 2 | Low or High | LPS | 0 | 100 |
|   |   | MPS | 0 | 10 |

As illustrated in Table 3, the output column depicts that every '1' bit is followed by at least one '0' bits and no more than three '0' bits. Therefore, the output adheres to the RLL (1,3) channel coding definition.

If the current state is state 0, there are two possible transition pairs. Each of the transition pairs is selected according to whether the skew is high or low. If there is a low probability that the MPS will occur, such that the skew is low, then the first transition pair is selected. If so, an input of the LPS causes an output stream of '10' to be output and the state machine remains in state 0. On the other hand, if the MPS occurs, then no bits are output and the state machine transitions to state 1. If the skew is high, an input of the LPS causes the bit-stream '1000' to be output and the state machine remains in a state 0. An MPS input, however, causes no bits to be output and the state machine transitions into state 2. If the state machine is in states 1 or 2, regardless of the skew, any input causes the next state to be state 0. For each particular case, the outputs are as shown. Thus, if the skew is low, thereby indicating high compression is not achievable, then the operation of a finite state machine defined in Table 3 operates in the same manner as Table 2. While if the skew is high, then the most frequent two input situation is coded as the bits '10'. It should be noted that this represents compression since normally two data bits would require at least 3.62 channel bits. Larger machines allow greater compression.

One embodiment of the combined channel coder and binary entropy coder of the present invention is shown in FIG. 7. Referring to FIG. 7, a LUT 702 is shown receiving a state 708 from state register 701, an outcome 703 and a probability estimate 707. Note that outcome 703 represents the bit stream input to be channel coded and compressed simultaneously. In response, LUT 702 outputs an output 705 and an output size 706. The LUT 702 also generates the next state 704 which is fed back to state register 701 for use as the state for the next input occurrence of outcome 703. The combined channel coder/binary entropy coder operates in the same manner as the channel coder of FIG. 5, except that the probability estimate 707 is used to select the set of transitions in each of the states.

In one embodiment, state register 701 may hold 2–8 bits, the probability estimate may be 1–4 bits, and outcome 703 is one bit. In this case, LUT 702 may receive 4–13 bits of input. It should be noted that state register 701 may be a register that stores any number of bits. Also, the probability estimate may be greater than four bits in other embodiments. The output 705 from LUT 702 is 2–8 bits for the binary entropy coder of the present invention. However, output 705 may be larger when joint data compression is performed. If this is the case, output size 706 is 2–4 bits to indicate all possible sizes of output 705.

Thus, a transition state machine can be designed according to the present invention to generate a bit stream that meets a constraint specified by a finite transition diagram, such that it will be possible to return to the original data stream as part of the decoding operation. In this manner, the present invention provides finite state machines that perform channel modulation, or perform compression and channel modulation simultaneously.

The present invention provides a state machine that produces outputs having a variable number of bits. Because the present invention is able to produce an output at a variable rate during channel modulation, the exact storage capacity of a disk drive is not independent of the data stored. However, since disk drives often have bad sectors and some compressed files, the exact storage capacity of a typical disk drive already has some uncertainty. Variable rate codes also allow a single error to affect more data than fixed rate codes. However, this same situation exists with currently compressed files on recorded media. In short, the variable rate constrained channel codes of the present invention have the same problems that exist with compressed files on normal disk drives. However, they are able to be more efficient in channel usage and possibly increase speed due to their joint operation (with data compression).

ERROR CORRECTION CODING

Error correction coding is often performed on data where the channel is not lossless. Error correction may be viewed as another constraint on the channel. That is, a sequence of arbitrary bits have some parity bits generated corresponding to them. The present invention also provides finite state machines to perform error correction coding on an input data stream. For some types of error control codes, it is possible to create a finite state machine which performs encoding. One of these types of error control codes are often referred to as convolutional codes. Convolutional codes are known to have a structure which allows them to be represented by a finite state transition diagram. Although convolutional codes may be used, the present invention may also implement other error correction codes using finite state machines. For instance, trellis codes may also be represented by a finite state transition diagram. Other codes may be used as long as they can be represented with a finite state transition diagram.

The finite state machines of the present invention may be designed such that their output includes the error correction bits integrated into the bits from the input bit stream. An example of a state table for a finite state machine that provides error correction is shown in Table 4.

TABLE 4

State Machine for Error Correction Encoding

| State | Input Bit | Next State | Output Bits |
|---|---|---|---|
| 0 | 0 | 0 | 00 |
|   | 1 | 2 | 11 |
| 1 | 0 | 0 | 11 |
|   | 1 | 2 | 00 |
| 2 | 0 | 1 | 01 |
|   | 1 | 3 | 10 |
| 3 | 0 | 1 | 10 |
|   | 1 | 3 | 01 |

Referring to Table 4, the state table operates in the same manner as that of Table 2. Using the current state and the input, the present invention outputs a bits stream having integrated error correction bits, and transitions to the designated next state for the next input. Similarly, the functional components used to implement Table 2, as shown in FIGS. 4 and 5, may be used to implement the state table in Table 4.

If data is compressed in a system using the binary coder of the present invention, the binary coder can be modified to provide both data compression and error correction encoding. That is, using a finite state machine, the present invention is able to perform data compression and error correction coding on an input bit stream simultaneously. The state machine of the present invention operates the same as the state machines described above that perform data compression and channel modulation simultaneously. In other words, the state machine receives the input bit stream, an indication of the current state, and a probability estimate and generates an output bit stream, wherein the probability estimate is used to select between multiple sets of transitions and the bit input selects the actual transition in the set of transitions selected by the probability estimation. An example of a state table for a finite state machine that provides error correction and data compression is shown in Table 5.

TABLE 5

State Machine For Error Correction Encoding and Data Compression

| STATE | SKEW | INPUT | NEXT STATE | OUTPUT |
|---|---|---|---|---|
| 0 | Low | LPS | 0 | 00 |
|   |     | MPS | 2 | 11 |
|   | High | LPS | 0 | 0000 |
|   |      | MPS | 4 | — |
| 1 | Low | LPS | 0 | 11 |
|   |     | MPS | 2 | 00 |
|   | High | LPS | 0 | 1100 |
|   |      | MPS | 5 | — |
| 2 | Low | LPS | 1 | 01 |
|   |     | MPS | 3 | 10 |
|   | High | LPS | 0 | 0111 |
|   |      | MPS | 6 | — |
| 3 | Low | LPS | 1 | 10 |
|   |     | MPS | 3 | 01 |
|   | High | LPS | 0 | 1011 |
|   |      | MPS | 7 | — |
| 4 | Low | LPS | 2 | 0011 |
|   |     | MPS | 2 | 11 |
|   | High | LPS | 2 | 0011 |
|   |      | MPS | 2 | 11 |
| 5 | Low | LPS | 2 | 1111 |
|   |     | MPS | 2 | 00 |
|   | High | LPS | 2 | 1111 |
|   |      | MPS | 2 | 00 |
| 6 | Low | LPS | 0 | 0111 |
|   |     | MPS | 3 | 10 |
|   | High | LPS | 0 | 0111 |
|   |      | MPS | 3 | 10 |
| 7 | Low | LPS | 0 | 1011 |
|   |     | MPS | 3 | 01 |
|   | High | LPS | 0 | 1011 |
|   |      | MPS | 3 | 01 |

In one embodiment, this type of finite state machine may be employed in systems such as that shown in FIG. 6, where compression encoder 601 and error correction encoder 603 are combined through their use of the finite state machine. In the present invention, the decoding is accomplished by separate error correction circuitry and decompression system. In other words, the decoding is not performed as a single stage.

The finite state machine of the present invention may be designed to provide error correction coding and channel modulation simultaneously. The present invention also provides for combining data compression, error correction, and channel coding into a single finite state machine. Using the same techniques described above, a finite state machine that receives an input data and compresses the data, performs error correction coding and channel coding simultaneously. In this case, the compression encoder (e.g., compression encoder 601), the error correction encoder (e.g., error correction encoder 602) and the channel modulation mechanism (e.g., modulation encoder 603) in a system such as shown in FIG. 6 would be combined into a single finite state machine providing an output representing the data subjected to the three functions. It is possible to have systems that uses multiple finite state machines, where each finite state machine provides for joint functionality as described above.

Each combination may allow increased speed, although the state tables required for this encoding can become large. In prior art recording systems, these functions are performed by separate units. Only one of the units is able to operate on the data at any one time. Furthermore, not all recording systems incorporate all of the functions. In this case, the system software must often be used to perform the function. This causes other system functions to be suspended. The present invention allows all of the functions to be performed by one unit. In the case of recording systems, system software perform compression. Separate hardware performs the error correction coding and the channel modulation. This hardware may be designed to include a finite state machine of the present invention that performs data compression, channel modulation and error correction simultaneously. For instance, the state machine receives the input bit stream, an indication of the current state and a probability estimation and generates an output bit stream, wherein the probability estimate is used to select between multiple sets of transitions and the bit input selects the actual transition in the set of transitions selected by the probability estimation. In this case, the system software would be free to perform other tasks and the hardware only requires one table look-up per input, thereby increasing the system speed.

DECODING BIT SEQUENCES

In any coding operation, (data compression, channel coding, or error control coding), it is essential that the original data can be obtained from the encoded data. In other words, given a compressed or otherwise coded data stream, there must be a unique sequence of original data which created that sequence. If this is the case, then the compressed sequence or the compression process is referred to as being uniquely decodeable. In the present invention, the codes are still uniquely decodeable. Furthermore, the codes of the present invention do not have the prefix property but they are still uniquely decodeable. This is evident by considering each encoding decision. The input probability is examined and used to select a pair of possible transitions. For any pair of transitions, one transition is capable of generating some of the sequences in the first set and the other transition is capable of generating a completely different set of sequences. A decoder can examine the bit sequence that actually occurred. If the sequence is in the first set of the first transition, then the encoder must have used that transition and the input which causes that transition to be used must have occurred. Otherwise, the sequence must be present in another set, and a different transition and, hence, input must have occurred.

Decoding of a sequence can be accomplished by a finite state machine that consumes the compressed bit sequence at a variable rate. In one embodiment, the decoder has one state for each state in the encoder and follows the transitions the encoder makes. In a given state, the decoder receives the same probability estimate the encoder receives, the decoder examines the bit stream produced by the encoder, and determines the transition that must have occurred. The decoder makes the same transition the encoder made, and removes any bits from the bit stream that the encoder would have added on that transition.

AUTOMATIC MACHINE GENERATION

The present invention provides a method for generating tables for constrained channel coding. Also, this table generation method may be used to generate the state machine for the bit generation portion of the binary entropy coder of the present invention. It should be noted that the method explained below does not necessarily produce the optimal state machine for bit generation, but it will create a transition machine and improve it by increasing the number of states.

The following description utilizes the following terms as defined below. A finite state transition diagram is an edge labeled graph. Each vertex is a possible current state and the labels on the edges indicate the possible bits in a sequence starting from that state. When a particular sequence of bits occurs matching one of the edges, the state is updated to be the terminus of the edge. The follower set of a state in a finite state transition diagram is the set of all possible sequences which can be generated by following any path initially starting in the state. All follower sets in the present invention have infinitely many elements and are defined recursively. For the run-length limited constraint diagrams, follower sets are recursive in that all of the sequences that begin in a particular state and return to that state can be followed by any of the other sequences beginning in that state.

The transition state diagram depicted in FIG. 8 will illustrate this recursive nature of some sequences. Referring to FIG. 8, state diagram 800 includes states 0–2 and transition arcs 801–805. Symbols "a" is output as part of a sequence when the state machine transitions from state 0 to state 1 (via transition arc 801 ). Symbols "b" or "c" are output as part of a sequence when the state machine transitions from state 1 to state 0 depending on whether transition arc 802 or 803 is taken, respectively. The symbol "c" is also output as part of a sequence when the state machine transitions from state 0 to state 2 (via transition arc 805). The symbol "d" is output as part of the sequence when the state machine transitions from state 2 to state 0 (via transition am 804).

In determining the follower set F for state 0, it is recognized that the follower set of the state includes all possible sequences from the state. For state 0, the symbols "ab" are output if the state machine transitions from state 0 to state 1 and returns via transition arc 802. Since the state machine has returned to state 0, the remaining portion of the sequence can be any member of the entire set of sequences available to state 0 in the first place. That is, all sequences that began with symbols "ab" include all possible transitions that existed before the state machine transitioned between states 0 and 1. Therefore, since all the sequences in the follower set F are available after the state machine transitions back to state 0, then the sequences beginning with the symbols "ab" can be renamed to "abF" where the "F" represents the follower set. Similarly, if the state machine transitions to state 1 and then back via transition arc 803, then the symbols "ac" are output and the entire follower set remains as possible sequences. Thus, all sequences beginning with the symbols "ac" may be characterized in the follower set F as "acF". The same holds true for sequences beginning with the symbols "cd". In sum, the follower set F for the state diagram in FIG. 8 includes the sequences F={abF, acF, cdF} where F "recursively" includes a reference to itself.

A flowchart depicting the table generation method of the present invention is shown in FIG. 9. Referring to FIG. 9, the present invention begins by creating an initial state machine (processing block 901) and then improving the initial state machine (processing block 902). In the present invention, the method is implemented in software used with a computer system.

The method for creating an initial state machine according to the present invention is shown in FIG. 10. Referring to FIG. 10, the method to create an initial state machine beings with a Finite State Transition Diagram (FSTD) representing the constraint, the error correction constraint or the bit generation portion of a binary entropy coder (processing block 1001).

Using the FSTD, the follower set for each state in the FSTD is generated (processing block 1002). The follower set may often be an infinite set. However, as mentioned above, if the follower set is infinite, it may be possible to label the set by a recursive definition.

After the follower set has been generated, the follower set is partitioned into two subsets based on the first possible symbol (processing block 1003). In other words, where a set includes all sequences beginning with the same symbol, this symbol can become an output for the transition. Note that where sequences begin with the same set of symbols, these symbols may become the output for the transition. For example, F={abF, acF, cdF} can be split into {abF, acF} and {cdF}.

For each subset, a transition is created (processing block 1004). In the present invention, if all members of the subset have the same beginning, then the common beginning is assigned as an output and the follower set is revised. If the follower set exists already as a state, then that state is made the terminus of the transition. For example with {abF, acF}, 'a' can be added to the transition and {bF, cF} becomes the new set. If the follower set does not exist as a state, then a new state is created with this set as the follower set.

After a transition is created for each subset, a test determines whether all of the states have an output transition (processing block 1005). If all of the states have an output transition, then the initial FSTD creation is complete. If one or more of the states does not have an output transition, then processing continues at blocks 1003 and 1004 for every state that does not yet have an output transition. The creation stage will eventually terminate because there are a finite number of transitions in the FSTD.

The present invention creates a machine that translates an arbitrary bit sequence into a sequence which meets the channel constraint simply by using one of the transitions for a '0' input and the other transition for a '1' input. Compression may be provided if one of the inputs is more likely than the other, and this input is always assigned to the transition which leads to shorter sequences (on average).

The initial state machine derived from following the steps depicted in FIG. 10 may not compress well or may even expand data if the probabilities are not as expected. Performance of the initial state machine may be improved in either case by adding more transitions to each state. Then using the estimate from the probability estimation machine, a transition pair is selected which has a skew close to the estimated skew and the outcome is used to determine which transition of the pair should be used to encode the input symbol.

One embodiment of the method for improving the initial state machine is shown in the flow chart in FIG. 11. Referring to FIG. 11, the present invention initially finds the part of the state machine which has the poorest performance according to some criteria (processing block 1101). The poorest performance may be identified according to the largest gap in probabilities between two transitions.

Next, a probability is determined that would improve performance if there was a transition at that probability (processing block 1102). The identification of such probability is application dependent. For instance, in one application, the selection of the probability may occur by selecting a probability between two endpoint probabilities. For instance, if there is a transition between 0.5 and 0.95, then one may be added at the midpoint 0.725 that is derived from the mean. Other decision methods can be used to minimize the expected output length.

Then, the follower set is partitioned into two subsets such that the relative size is close to the probability located to improve the performance (processing block 1103). In other words, the set is divided such that the cumulative probabilities in one of the sets is equal to or relatively close to the desired probability.

Then for each subset, a transition is created (processing block 1104) in the same manner as that of the initial creation method (i.e., processing block 1004). In the present invention, if all members of the subset have the same beginning, then the common beginning is assigned as an output and the follower set is revised. If the follower set exists already as a state, then that state is made the terminus of the transition. If the follower set does not exist as a state, then a new state is created with this set as the follower set.

A test then determines whether a termination criteria has been met (processing block 1105). If the criteria has been met, the process ends. Processing blocks 1101–1104 are repeated until a termination criteria is satisfied. In one embodiment, this criteria may be either that a maximum number of states has been reached or a desired performance level has been reached. Performance levels may be determined by measuring performance of the transition state machine against the Shannon limit. In one embodiment, the average output length for typical files may be computed and when the average length reaches some predetermined minimum, the process of the present invention ends.

In some instances, the machine generation method of the present invention improves a state machine without the addition of any states. In other situations, a few states may be added to the machine. This method can be used repeatedly until a machine of the desired size or performance is achieved.

FIGS. 12, 13A and 13B depict an example of the method of the present invention. FIG. 12 illustrates a FSTD that allows only sequences which meet the RLL(1,3) code constraint. Thus, FIG. 12 describes a constrained channel. Note that FIG. 12 has been drawn with only one state, although it is possible to draw an equivalent diagram with three or four states.

The FSTD shown in FIG. 12 represents the FSTD that is required in the first stage of machine generation according to the present invention. Once the initial FSTD is identified, the follower set is provided. The follower set has infinite size, but can be represented as F={10F,100F,1000F}, wherein the set consists of 10 followed by anything in the set, or '100' followed by anything in the set, or '1000' followed by anything in the set. After the follower set F has been identified, the set F can be partitioned into two subsets, Fa={10F} and Fb={100F, 1000F}.

Since the set Fa always begins '10', this may be assigned to the output of one transition. This makes the follower set just F which is already a state and so the destination for this transition can be State 0. The second subset, Fb, always begins with 100 so this can be assigned to the output leaving {F,0F} as the follower set. This set does not exist, so a new state is created. In the case of FIG. 13A, nothing has been added to the transition so the set remains {100F, 1000F}.

The new state does not have any output transitions, so it is necessary to split its follower set. This can be done creating Fc={100F} and Fd={1000F}. The set Fc is equivalent to 100 followed by F so no output 100 is added to transition and a transition can be made to State 1000. Fd always begins 0. Therefore, this can be assigned to the output and the transition can be made to State 0. Now there are no states which do not have output transitions so an initial machine has been created. This machine is drawn in FIG. 13A. Referring to FIG. 13A, the follower sets have been listed along the transitions and at the two states. The outputs are also listed on each transition. Each state has two output transitions, by assigning a zero input to use the first transition and a one input to use the second transition, a machine equivalent to the one in Table 4 has been created. In the case of FIG. 13A, nothing has been added to the transition so the set remains {100F, 1000F}.

This state machine may be improved using the method described in FIG. 11. Initially, the worst state is identified. Suppose that the worst state is state 0, then any transition at a probability different than the current probability will improve performance. Suppose that it is desirable to add a transition for probabilities close to 0.70. A new division of the set F is possible. Let Fe={100F} and Ff={10F, 1000F} this partitions the set in a different way, and roughly 70% of the possible sequences are in set Ff. FIG. 13B illustrates such a finite state transition diagram.

The transitions are then created. Referring to FIG. 13B, the set Fe can be made into a transition by making 100 the output and state 0 the destination. The set Ff causes 10 to be output and a transition to a new state with follower set {F,00F} to be made. This new state may have a transition added by splitting the set into {F} and {0OF}. Both of these transitions can return to state 0 with an appropriate output. This improved state machine is equivalent to the one listed in Table 5 and allows some compression at high skews.

As for the termination criteria, it is assumed in this example that the maximum desired number of states is three. Therefore, the automatic state machine generation method of the present invention has satisfied its termination criteria and ends.

Another example of using the machine generation method is illustrated in FIGS. 14 and 15. FIG. 14 illustrates a finite state transition diagram for a morse code. To maximize use of the channel, it is desirable to utilize the "." (dot) more than the "-" (dash) because the dot takes up less space. For the remainder of the example, the words "dot" and "dash" are substituted for their symbols in the text and the drawings. The maxentropic probabilities (those which make most efficient use of the channel) for each of the transitions are 68.23% (or 0.6823) for the dot and 31.77% (or 0.3177) for the dash assuming the dash and the silent space after is three times the duration of the dot and its silent space. Thus, this state transition diagram adequately represents the approximately 70% case. This state transition diagram could be used to perform channel modulation, but it would not be adequate for data compression at probabilities far from 0.70. For instance, it is not efficient for the 0.50 case.

To create a finite state transition diagram that better models the 50% case, the length-two sequences are examined, instead of the length-one sequences. Since there are two symbols, dot and dash, there are four length-two sequences. The four length two sequences and their associated probabilities of occurrence (as determined by multiplying the independent probabilities of occurrence together) are: dot-dot (0.466), dot-dash (0.217), dash-dot (0.217), dash-dash (0.10). This illustrates the follower set to the extent that all length-two sequences are depicted for every possible transition path from a first state.

Since a state is only allowed two out-going transitions per probability class, this set is separated into two sets. The choice of the contents of the sets is based on the desired probabilities. If a 50% case is desired, the two sets can be [dot-dot] and [dot-dash, dash-dot, dash-dash] since the probability of [dot-dot] is approximately 0.50 (i.e., it is 0.466). The [dot-dot] then represents the value assigned the first transition arc 1501 leaving state 0. Also because the probability is below 50%, the sequence [dot-dot] is designated the LPS. The second transition arc 1502 is then designated the MPS; there is no output associated with the transition. Note that this is due to the fact that there are no common prefix in the symbols of that group.

Once at state 1, two out-going transitions must be identified. Therefore, the set [dot-dash, dash-dot, dash-dash] must be separated. In order to better model the 50% case, the selection of sets is done to separate this set as close to 50% as possible. Normalizing the possibilities in the set results in probabilities for [dot-dash] being 0.406, [dash-dot] being 0.406 and [dash-dash] being 0.188. In view of this, either [dot-dash] or [dash-dot] is chosen as the LPS. As shown in FIG. 15, transition arc 1506 represents the [dot-dash] transition back to state 0. The other transition arc 1503 leaving state 1 is designated the MPS symbol because the probabilities in the set are greater than 0.5. Transition arc 1503 transitions to state 2 without any output.

At state 2, the two transitions must be identified. Since only two symbols remain [dash-dot, dash-dash], each is assigned to one of the transition arcs 1504 and 1505. The transitions all return to state 0 because after such a transaction, all possible length two sequences must be available for transitioning.

Note that the original probability distribution has been included at state 0 as arcs 1510 and 1511. Depending on the probability estimate, either the solid lines or the dotted lines are selected. All of the states can be designed to include multiple arcs chosen based on probability. In this manner, the state machine defined in FIG. 15 may be used for data compression and another constraint, such as channel coding.

FIGS. 16A–16D provide illustrations of four specific embodiments of state machine transition matrices generated using the table generator method of the present invention. For each state machine illustrated, the first set of three columns correspond to the "Y" decision (likely), or MPS, while the second set of three columns corresponds to the 'N' decision. The last column indicates the probabilities. FIG. 16D illustrates a table for performing binary compression.

Referring to FIG. 16a, a two-state transition machine transition diagram is shown. Transition pairs are labeled as columns (1) and (2). If the state machine is in state S0 and the threshold (probability estimate) is greater than 0.644, the two legal transitions are stay in state S0 and output bit string "11" for a N (no) decision or transition to state S1 and do not output a bit string at all for a Y (yes) decision. If the threshold (probability estimate) is below 0.644 in state S0, the two legal transitions are stay in state S0 and output bit string "1" for a N (no) decision or stay in state S0 and output bit string "0" for a Y (yes) decision. If the state machine is in state S1, the two legal transitions are to transition to state S0 and output bit string "10" for a N (no) decision or transition to state S0 and output bit string "0" for a Y (yes) decision.

The method of the present invention is implemented using computer software. Such software could be designed to generate transition state machines according to some criteria, such as a desire to have 50% transitions, a limited or specific number of states or a limited or specific number of probability classes.

Thus, the automatic machine generation method of the present invention is used to create finite state machines to convert arbitrary bit streams to bit streams meeting various run length limited constraints, as well as for other constrained channels. It also allows larger state machines to be created for the normal unconstrained binary channels.

CODING LARGER ALPHABETS

The binary entropy coder of the present invention usually codes binary inputs. It is possible for the binary entropy coder to code a slightly larger alphabet. For example, to code an alphabet with three symbols, (a,b,c), it is necessary to have three transitions out of every state rather than just two. One transition is assigned to each member of the alphabet. As described above, in the state machine generation methods section, the follower set would be split into 3 disjoint subsets instead of two. This is quite feasible for fixed probability symbols, but becomes very difficult with changing probability distributions. Thus, although the binary entropy coder of the present invention may code a slightly larger alphabet, the state table creation would at some point become unmanageable.

In the case of three symbols, the estimates of two probabilities are required to specify each distribution. This alone doubles the probability estimate inputs required for the lookup table. For every combination of estimates for these two symbols, there must be a different transition triple. With too many input symbols, it will be necessary to have the context model separate things into binary decisions.

The present invention provides for using finite state machines for constrained channels. Although these finite state machines may be used in disk drives, they may also be applied to the constrained channels used in CD ROMs, erasable optical disks, and even fiber optic channel.

The present invention also provides for simultaneous operation of bit generation and channel coding or error correction. In addition, a method of automatically generating finite state machines to perform these tasks has been described. The method of the present invention allows for the creation of finite state is necessary to be able to create the machines for the previous joint operations. This technology may be useful in magnetic disk drives, CD-ROMs, magneto-optical drives, or any situation where constrained channels and/or error correction are used.

While the invention has been described in conjunction with preferred embodiments, it is evident that numerous alternatives, modifications, variations and uses will be apparent to those skilled in the art in light of the foregoing description.

Thus, a method and apparatus for generating a bit stream has been described.

We claim:

1. A method for performing channel modulation and compression on an input bit stream having a plurality of input bits, said method comprising the steps of:

locating a transition in at least one transition pair in one of a plurality of states in a transition machine according to a portion of said plurality of input bits, wherein each of said plurality of states in said transition machine has at least one transition pair, and wherein each transition in said at least one transition pair is associated with an output bit stream that is output when said each transition is selected, and further wherein each of the output bit streams comprises a channel coded and compressed representation of input bits; and outputting the output bit stream associated with said transition and transitioning to a next state, wherein a variable number of bits is output from the transition machine for each portion of said plurality of input bits, wherein a plurality of output bits are generated in response to the input bit stream, such that the input bit stream is channel coded and compressed by use of a single transition machine.

2. The method defined in claim 1 wherein the bit stream for each of the transitions adheres to a channel constraint.

3. The method defined in claim 2 wherein the bit stream output for each of the transitions represents a run length limited coded version of the plurality of input bits.

4. The method defined in claim 1 wherein each portion of the plurality of input bits comprises one bit.

5. The method defined in claim 1 wherein each of the output bit streams comprises a compressed representation of the portion of said plurality of input bits, such that the input bit stream is compressed and channel coded.

6. The method defined in claim 1 further comprising the steps of:

receiving a probability for the portion of said plurality of input bits;

receiving an indication for said portion of the plurality of input bits, wherein the indication indicates whether said portion of plurality of input bits is within one of a plurality of possible first states, wherein the transition is located according to probability and the indication.

7. The method defined in claim 6 wherein the indication comprises a binary decision pair.

8. The method defined in claim 6 wherein the indication comprises a yes/no indicative.

9. The method defined in claim 6 wherein the probability comprises a probability estimate.

10. A method for performing channel modulation and compression on an input bit stream having a plurality of input bits, said method comprising the steps of:

receiving one of said plurality of input bits;

locating a transition in at least one transition pair in one of a plurality of states in a transition machine according to said one of said plurality of input bits, wherein each of said plurality of states in the transition machine have at least one transition pair and each of the transitions in said at least one transition pair is associated with an output bit stream, wherein each output bit stream comprises a compressed and channel coded representation of input bits; and outputting the output bit stream associated with said transition, wherein a variable number of bits is output from the transition machine for each portion of said plurality of input bits, wherein a plurality of output bits are generated in response to the input bit stream, such that the input bit stream is compressed and channel coded by use of a single transition machine.

11. The method defined in claim 10 wherein the bit stream for each of the transitions adheres to a channel constraint.

12. The method defined in claim 10 wherein the bit stream output for each of the transitions represents a run length limited coded version of the plurality of input bits.

13. The method defined in claim 10 further comprising the step of transitioning to a next state after outputting the bit stream, wherein the next state is indicated by the transition.

14. The method defined in claim 10 further comprising the steps of:

receiving a probability for said one of said plurality of input bits;

receiving an indication for said one of the plurality of input bits, wherein the first indication indicates whether said one of plurality of input bits is within one of a plurality of possible first states, wherein the transition is located according to probability and the indication.

15. The method defined in claim 14 wherein the indication comprises a binary decision pair.

16. The method defined in claim 14 wherein the indication comprises a yes/no indicative.

17. The method defined in claim 14 wherein the probability comprises a probability estimate.

18. A method for performing channel modulation and compression on an input bit stream having a plurality of input bits, said method comprising the steps of:

receiving a first threshold value for one of the plurality of inputs;

receiving a first indication for said one of the plurality of inputs, wherein said first indication indicates whether said one of the plurality of inputs is within one of the plurality of possible first states;

selecting one of a plurality of sets of transitions in one of a plurality of transition states according to the first threshold value, wherein each transition in the plurality of sets of transitions is associated with an output and a next state within the plurality of transition states, and further wherein each output comprises a channel modulated and compressed representation of a portion of said plurality of input bits;

selecting a transition in said one of a plurality of sets of transitions according to said first indication; and outputting the output associated with the transition, wherein a variable number of bits is output from the transition machine for each of said plurality of input bits, such that the input bit stream is channel coded and compressed by use of a single transition machine.

19. The method defined in claim 18 further comprising the step of transitioning to the next state associated with the transition, such that a transition within the next state is selected using a second threshold value and a second indication corresponding to an input immediately following said one of the plurality of inputs.

20. A method for performing error correction coding and channel coding on an input bit stream having a plurality of input bits, said method comprising the steps of:

receiving a portion of said plurality of input bits;

locating a transition in at least one transition pair in one of a plurality of states in a transition machine according to said portion of said plurality of input bits, wherein each of said plurality of states in the transition machine has at least one transition pair and each of the transitions in said at least one transition pair is associated with an output bit stream, and further wherein each output bit stream comprises a channel coded and error correction coded representation of the portion of said plurality of input bits; and outputting the output bit stream associated with said transition and transitioning to the next state, wherein a plurality of output bits are generated in response to the input bit stream, such that the input bit stream is error correction coded and channel coded by use of a single transition machine.

21. The method defined in claim 20 wherein each portion of the plurality of input bits comprises one bit.

22. The method defined in claim 20 wherein the error correction coding is a convolutional code.

23. The method defined in claim 20 wherein the error correction coding is a trellis code.

24. The method defined in claim 20 further comprising the step of transitioning to a next state after outputting the bit stream, wherein the next state is indicated by the transition.

25. The method defined in claim 20 further comprising the steps of:

receiving a probability for the portion of said plurality of input bits;

receiving an indication for said portion of the plurality of input bits, wherein the indication indicates whether said portion of plurality of input bits is within one of a plurality of possible first states, wherein the transition is located according to probability and the indication.

26. The method defined in claim 25 wherein the indication comprises a binary decision pair.

27. The method defined in claim 25 wherein the indication comprises a yes/no indicative.

28. The method defined in claim 25 wherein the probability comprises a probability estimate.

29. A method for performing error correction and compression on an input bit stream having a plurality of input bits, said method comprising the steps of:

receiving one of said plurality of input bits;

locating a transition in at least one transition pair in one of a plurality of states in a transition machine according to said one of said plurality of input bits, wherein each of said plurality of states in the transition machine has at least one transition pair and each of the transitions in said at least one transition pair is associated with an output bit stream, wherein each output bit stream comprises a compressed and error correction coded representation of one of said plurality of input bits; and outputting the output bit stream associated with said transition, wherein a variable number of bits is output from the transition machine for each portion of said plurality of input bits, wherein a plurality of output bits are generated in response to the input bit stream, such that the input bit stream is compressed and error correction coded by use of a single transition machine.

30. The method defined in claim 29 wherein the error correction coding is a convolutional code.

31. The method defined in claim 29 wherein the error correction coding is a trellis code.

32. The method defined in claim 29 further comprising the step of transitioning to a next state after outputting the bit stream, wherein the next state is indicated by the transition.

33. The method defined in claim 29 further comprising the steps of:

receiving a probability for said one of said plurality of input bits;

receiving an indication for said one of the plurality of input bits, wherein the indication indicates whether said one of plurality of input bits is within one of a plurality of possible first states, wherein the transition is located according to probability and the indication.

34. The method defined in claim 33 wherein the indication comprises a binary decision pair.

35. The method defined in claim 33 wherein the indication comprises a yes/no indicative.

36. The method defined in claim 33 wherein the probability comprises a probability estimate.

37. A method for performing coding on an input stream, wherein the input stream comprises a plurality of symbols from an alphabet of a symbols, said method comprising the steps of:

receiving a symbol in the input stream;

selecting a transition in one of a plurality of states in a transition machine having a plurality of states, wherein each of the plurality of states has at least one transition for each of the predetermined number of symbols in the alphabet, and wherein each of the transitions is associated with an output stream, wherein the transition in said one of said plurality of states is selected according to the symbol in the input stream;

outputting the output stream associated with said transition and transition to a next state, wherein a variable number of symbols is output from the transition machine for at least two distinct symbols in the input stream, such that the input stream is coded.

38. The method defined in claim 37 wherein each output stream is chosen, such that output stream is outputted, such that the input stream is channel modulated.

39. The method defined in claim 37 wherein each output stream is chosen, such that output stream is outputted, such that the input stream is channel modulated and compressed by use of a single transition machine.

40. The method defined in claim 37 further comprising the steps of:

receiving a probability for the symbol;

receiving an indication for said symbol, wherein the indication indicates whether said symbol is within one of a plurality of possible first states, wherein the transition is located according to probability and the indication.

41. The method defined in claim 40 wherein the indication comprises a binary decision pair.

42. The method defined in claim 40 wherein the indication comprises a yes/no indicative.

43. The method defined in claim 40 wherein the probability comprises a probability estimate.

44. A method for performing coding on an input stream, wherein the input stream comprises a plurality of symbols from an alphabet of a symbols, said method comprising the steps of:

receiving a symbol in the input stream;

selecting a transition in one of a plurality of states in a transition machine having a plurality of states, wherein each of the plurality of states has at least one transition for each of the predetermined number of symbols in the alphabet, and wherein each of the transitions is associated with an output stream, wherein the transition in said one of said plurality of states is selected according to the symbol in the input stream;

outputting the output stream associated with said transition and transition to a next state, wherein a variable number of symbols is output from the transition machine for at least two distinct symbols in the input stream, such that output stream is outputted, such that the input stream is error correction coded.

45. The method defined in claim 44 further comprising the steps of:

receiving a probability for the symbol;

receiving a indication for said symbol, wherein the indication indicates whether said symbol is within one of a plurality of possible first states, wherein the transition is located according to probability and the indication.

46. The method defined in claim 45 wherein the indication comprises a binary decision pair.

47. The method defined in claim 45 wherein the indication comprises a yes/no indicative.

48. The method in claim 45 wherein the probability comprises a probability estimate.

49. A method for performing coding on an input stream, wherein the input stream comprises a plurality of symbols from an alphabet of a symbols, said method comprising the steps of:

selecting a transition in one of a plurality of states in a transition machine having a plurality of states, wherein each of the plurality of states has at least one transition for each of the predetermined number of symbols in the alphabet, and wherein each of the transitions is associated with an output stream, wherein the transition in said one of said plurality of states is selected according to a symbol in the input stream;

outputting the output stream associated with said transition and transition to a next state, wherein a variable number of symbols is output from the transition machine for at least two distinct symbols in the input stream, such that the input stream is channel modulated and error correction coded.

50. A method for performing coding on an input stream, wherein the input stream comprises a plurality of symbols from an alphabet of a symbols, said method comprising the steps of:

selecting a transition in one of a plurality of states in a transition machine having a plurality of states, wherein each of the plurality of states has at least one transition for each of the predetermined number of symbols in the alphabet, and wherein each of the transitions is associated with an output stream, wherein the transition in said one of said plurality of states is selected according to a symbol in the input stream;

outputting the output stream associated with said transition and transition to a next state, wherein a variable number of symbols is output from the transition machine for at least two distinct symbols in the input stream, such that the input stream is compressed, channel modulated and error correction coded.

51. A method for performing coding on an input stream, wherein the input stream comprises a plurality of symbols from an alphabet of a symbols, said method comprising the steps of:

selecting a transition in one of a plurality of states in a transition machine having a plurality of states, wherein each of the plurality of states has at least one transition for each of the predetermined number of symbols in the alphabet, and wherein each of the transitions is associated with an output stream, wherein the transition in said one of said plurality of states is selected according to a symbol in the input stream;

outputting the output stream associated with said transition and transition to a next state, wherein a variable number of symbols is output from the transition machine for at least two distinct symbols in the input stream, such that the input stream is error correction coded and compressed.

52. An apparatus for performing channel modulation on an input bit streams having a plurality of input bits, said apparatus comprising:

a transition machine having a plurality of states, each of said plurality of states having at least one transition pair, and wherein each transition in said at least one transition pair is associated with an output bit stream that is output when each transition is selected, and further wherein said at least one transition pair is chosen according to a portion of said plurality of input bits, wherein each of the output bit streams comprises a channel coded and compressed representation of input bits;

means for selecting a transition in said at least one transition pair in said one of said states according to said portion of said plurality of input bits; and means for outputting the output bit streams associated with said transition and transitioning to the next state, wherein a variable number of bits is output from the transition machine for each portion of said plurality of input bits, wherein a plurality of input bits are generated in response to the input bit streams, such that the input bit streams is channel coded and compressed by use of a single transition machine.

53. The apparatus defined in claim 52 wherein said transition machine comprises a ROM.

54. The apparatus defined in claim 52 wherein each portion of a plurality of input bits comprises one bit.

55. An apparatus for performing channel modulation on an input bit streams having a plurality of input bits, said apparatus comprising:

a transition machine having a plurality of states, each of said plurality of states having at least one transition pair, and wherein each transition in said at least one transition pair is associated with an output bit stream that is output when each transition is selected, and further wherein said at least one transition pair is chosen according to a portion of said plurality of input bits, wherein each of the output bit streams comprises a channel coded and channel error correction coded representation of input bits;

means for selecting a transition in said at least one transition pair in said one of said states according to said portion of said plurality of input bits; and means for outputting the output bit streams associated with said transition and transitioning to the next state, wherein a variable number of bits is output from the transition machine for each portion of said plurality of input bits, wherein a plurality of input bits are generated in response to the input bit streams, such that the input bit stream is error correction coded and channel coded.

56. An apparatus for performing channel modulation on an input bit streams having a plurality of input bits, said apparatus comprising:

a transition machine having a plurality of states, each of said plurality of states having at least one transition pair, and wherein each transition in said at least one transition pair is associated with an output bit stream that is output when each transition is selected, and further wherein said at least one transition pair is chosen according to a portion of said plurality of input bits, wherein each of the output bit streams comprises a compressed, channel coded, and channel error correction coded representation of input bits;

means for selecting a transition in said at least one transition pair in said one of said states according to said portion of said plurality of input bits; and means for outputting the output bit streams associated with said transition and transitioning to the next state, wherein a variable number of bits is output from the transition machine for each portion of said plurality of input bits, wherein a plurality of input bits are generated in response to the input bit streams, such that the input bit stream is compressed, error correction coded and channel coded.

57. An apparatus for performing error correction on an input bit stream having a plurality of input bits, said apparatus comprising a transition machine having a plurality of states, wherein each of the plurality of states has at least one transition pair and each of the transition in said at least one transition pair is associated with an output bit stream, wherein each output bit stream comprises a compressed and error correction coded representation of input bits;

means for selecting a transition in said at least one transition pair in said one of said states according to said portion of said plurality of input bits; and means for outputting the output bit stream associated with said transition, wherein a variable number of bits is output from the transition machine for each portion of said plurality of input bits, wherein a plurality of output bits are generated in response to the input bit stream, such that the input bit stream is compressed and error correction coded.

* * * * *